United States Patent
Nozawa et al.

(10) Patent No.: US 8,110,044 B2
(45) Date of Patent: Feb. 7, 2012

(54) SUBSTRATE PROCESSING APPARATUS AND TEMPERATURE CONTROL DEVICE

(75) Inventors: Toshihisa Nozawa, Amagasaki (JP); Koji Kotani, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 866 days.

(21) Appl. No.: 10/548,320

(22) PCT Filed: Mar. 5, 2004

(86) PCT No.: PCT/JP2004/002815
§ 371 (c)(1),
(2), (4) Date: Mar. 13, 2007

(87) PCT Pub. No.: WO2004/079805
PCT Pub. Date: Sep. 16, 2004

(65) Prior Publication Data
US 2007/0272155 A1    Nov. 29, 2007

(30) Foreign Application Priority Data
Mar. 7, 2003  (JP) .................................. 2003-061607

(51) Int. Cl.
*H01L 21/205* (2006.01)
(52) U.S. Cl. .............. 118/725; 156/345.27; 156/347.37; 165/287; 165/294
(58) Field of Classification Search .................. 118/725; 156/345.27, 345.37; 165/287, 294
See application file for complete search history.

(56) References Cited

U.S. PATENT DOCUMENTS

| | | | |
|---|---|---|---|
| 5,802,856 A * | 9/1998 | Schaper et al. | 118/724 |
| 5,849,076 A | 12/1998 | Gaylord et al. | |
| 6,039,811 A * | 3/2000 | Park et al. | 118/719 |
| 6,148,145 A | 11/2000 | Kadotani | |
| 6,148,626 A | 11/2000 | Iwamoto | |
| 6,157,778 A | 12/2000 | Kadotani | |
| 6,440,221 B2 * | 8/2002 | Shamouilian et al. | 118/724 |
| 6,949,722 B2 * | 9/2005 | Strang et al. | 219/444.1 |
| 7,235,137 B2 * | 6/2007 | Kitayama et al. | 118/724 |
| 7,311,782 B2 * | 12/2007 | Strang et al. | 118/724 |
| 2007/0272155 A1 * | 11/2007 | Nozawa et al. | 118/725 |

FOREIGN PATENT DOCUMENTS

| | | |
|---|---|---|
| EP | 0 864 827 A1 | 9/1998 |
| JP | 07-326587 A | 12/1995 |
| JP | 09-280756 A | 10/1997 |

(Continued)

OTHER PUBLICATIONS

Japanese Office Action dated Jun. 17, 2008 (Three (3) pages).

*Primary Examiner* — Sylvia R. MacArthur
(74) *Attorney, Agent, or Firm* — Crowell & Moring LLP

(57) ABSTRACT

A first flow passage (16), which cools a temperature controlled object by a circulating first cooling water (15), and a second flow passage (19) separate from the first flow passage are provided so as to exchange heat between a second cooling water (18) flowing through the second flow passage (19) and the first cooling water (15). There is no need to store the first cooling water (15) in a tank of a constant capacity, and the first cooling water (15) flowing through the first flow passage (16) of a chiller corresponding part is absorbed substantially in its entirety by the second cooling water (18). A response becomes quick with respect to a load fluctuation of the temperature controlled object, and waste of energy can be reduced while improving accuracy of temperature control.

22 Claims, 12 Drawing Sheets

FOREIGN PATENT DOCUMENTS

| | | |
|---|---|---|
| JP | 10-74699 A | 3/1998 |
| JP | 10-209125 A | 8/1998 |
| JP | 11-183005 A | 7/1999 |
| JP | 2000012463 A * | 1/2000 |
| JP | 2001-332463 A | 11/2001 |
| JP | 2002-164288 A | 6/2002 |
| JP | 2002-339073 A | 11/2002 |
| WO | WO 97/20179 | 8/1997 |

* cited by examiner

SUBSTRATE PROCESSING APPARATUS AND TEMPERATURE CONTROL DEVICE

TECHNICAL FIELD

The present invention relates to a substrate processing apparatus and a temperature control device and, more particularly, to a substrate processing apparatus which applies a process, such as plasma CVD (Chemical Vapor Deposition) or etching, to a substrate such as a semiconductor wafer and a temperature control device used for such a substrate processing apparatus.

BACKGROUND ART

Conventionally, there is a cooling device having a flow passage of cooling water formed as a coil shape of an outer surface of a reaction furnace of a substrate processing apparatus for a semiconductor substrate or the like so as to control heat generated by the reaction furnace (for example, refer to Japanese Laid-Open Patent Application No. 2001-332463). In this cooling device, the cooling water which has absorbed heat is circulated after cooling at a predetermined temperature by a cooling water chiller. The above-mentioned cooling device has a cooling part and a heating part so as to normally make the cooling water temporarily at a low-temperature by operating at a full cooling capacity and then raising the temperature by a heater in the cooling device to control at a predetermined temperature and circulate it in the flow passage by a circulating pump. Accordingly, there is a problem in that unnecessary heating must be made and an efficient energy use is not sufficient.

Additionally, since the cooling water is temporarily stored in a tank in the chiller, if a capacity of the cooling water tank is large, a response to a load fluctuation of an apparatus which is an object to be cooled is slow, and there is a problem that an accuracy of temperature control of the apparatus which is an object to be temperature-controlled is not good.

DISCLOSURE OF THE INVENTION

It is a general object of the present invention to provide an improved and useful substrate processing apparatus and a temperature control device used for such a substrate processing apparatus in which the above-mentioned problems are eliminated.

A more specific object of the present invention is to provide a substrate processing apparatus, which has high energy efficiency and superior temperature control accuracy of an object to be temperature-controlled and a temperature control device used for such a substrate processing apparatus.

In order to achieve the above-mentioned objects, there is provided according to one aspect of the present invention a substrate processing apparatus comprising: a substrate processing part that has a temperature controlled object and applies a predetermined process to a substrate; a first flow passage that causes a first temperature control fluid to circulate, a part of the first flow passage passing through the substrate processing part, the first temperature control fluid for controlling a temperature of the temperature controlled object; a second flow passage that causes a second temperature control fluid to flow therethrough, the second temperature control fluid exchanging heat with the first temperature control fluid; and flow amount control means for controlling an amount of flow of at least the second temperature control fluid.

Here, although the temperature controlled object means a part of a housing of a process part body in the substrate processing apparatus, such as a semiconductor wafer, of course, it may be the entire housing or inside a process chamber. Additionally, the temperature control fluid corresponds to, for example, a cooling fluid or a heating fluid, and the fluid may be a gas. Specifically, for example, a cooling water or the like corresponds to it.

In the present invention, the first flow passage, which cools the temperature controlled object by the circulating first cooling water, and the second flow passage separate from the first flow passage are provided so as to exchange heat between the second cooling water flowing through the second flow passage and the first cooling water. There is no need to store the first cooling water in a tank of a constant capacity, and the first cooling water flowing through the first flow passage of a chiller corresponding part is absorbed substantially in its entirety by the second cooling water. A response becomes quick with respect to a load fluctuation of the temperature controlled object, and waste of energy can be reduced while improving accuracy of temperature control.

Additionally, the substrate processing apparatus according to the present invention has the flow amount control means which controls an amount of flow per unit time (hereinafter an amount of flow per unit time is simply referred to as an amount of flow) of the second cooling water flowing through the second flow passage. Accordingly, waste of energy can be avoided such as cooling on a chiller side and further heating at the same location to make the first cooling water of a predetermined temperature as in a conventional manner. Additionally, it can be changed to an appropriate amount of flow with respect to a load fluctuation of the temperature controlled object and a response becomes quick with respect to the load fluctuation, which improves accuracy of temperature control.

The substrate processing apparatus according to the present invention preferably further comprising temperature detection means provided in the substrate processing part for detecting a temperature of the temperature controlled object in the first flow passage. Thereby, the temperature of the temperature controlled object, such as, for example, the predetermined part of the process part body can be grasped and controlled accurately.

Additionally, in the substrate processing apparatus according to the present invention, the flow amount control means preferably controls an amount of flow of the second temperature control fluid based on information detected by the temperature detection means. Thereby, an amount of flow of the second temperature control fluid can be a most appropriate amount with respect to a load fluctuation of the temperature controlled object, and a response becomes quick with respect to the load fluctuation of the temperature controlled object, and waste of energy can be reduced while improving accuracy of temperature control.

Further, in the substrate processing apparatus according to the present invention, the substrate processing part preferably includes: a heater that secondarily heats the substrate processing part; and temperature control means that controls a temperature of the heater. Thereby, for example, a temperature inside a heating furnace can be raised to a constant temperature beforehand by a small energy, which reduces waste of energy.

Additionally, the substrate processing apparatus according to the present invention may further comprise: a pump that is provided in said first flow passage to cause said first temperature control fluid to circulate; and means for controlling an operation of said pump based on information detected by said temperature detection means.

Thereby, since pressurization can be made by the pump, for example, the first cooling water circulates through the first flow passage and the entire first cooling water contributes to the exchange of heat, which improves a temperature control efficiency.

Additionally, since an operation of the pump can be controlled based on the information detected by the temperature detection means, an adjustment such as an increase in a rotation speed of the pump so as to increase an amount of flow if the temperature is high, which enables more accurate temperature control and reduces waste of energy. Additionally, a control of the pump may be merely ON/OFF control.

In the substrate processing apparatus according to the present invention, the second flow passage may be branched into a plurality of flow passages in a middle thereof, and said flow amount control means and the first flow passage are provided in each of the branched second flow passages, said first temperature control fluid, which exchanges heat with the second temperature control fluid flowing through the branched second flow passages, respectively, circulating through the first flow passage. Thereby, since the water source of the plant circulating water, which is the second temperature control fluid, is one and a plurality of first flow passages can be formed, the second flow passage can be simplified, and temperatures of a plurality of temperature controlled objects can be adjusted simultaneously while reducing a cost.

Additionally, in the substrate processing apparatus according to the present invention, the respectively formed plurality of first flow passages may be formed by being brought together into one first flow passage in the middle. Thus, by connecting a plurality of heat exchangers, which exchange heat between the first temperature control fluid and the second temperature control fluid, in parallel together with the flow amount control means, an amount of heat exchange can be increased as compared to a case of a single heat exchanger. Therefore, the plurality of heat exchanges are operated simultaneously when a large cooling capacity is needed and a single heat exchanger is operated when a small cooling capacity is sufficient, thereby reducing waste of energy.

Additionally, there is provided according to another aspect of the present invention a substrate processing apparatus comprising: a substrate processing part that has a temperature controlled object and applies a predetermined process to a substrate; a first flow passage that causes a first temperature control fluid to circulate, a part of the first flow passage passing through the substrate processing part, the first temperature control fluid for controlling a temperature of the temperature controlled object; a second flow passage that causes a second temperature control fluid to flow therethrough, the second temperature control fluid exchanging heat with the first temperature control fluid; and flow amount control means for controlling an amount of flow of the first temperature control fluid.

In the substrate processing apparatus according to the above-mentioned invention, since it has the flow amount control means to control an amount of flow of the first cooling water flowing through the first flow passage, a change can be made to an appropriate amount to a load fluctuation of the temperature controlled object and a quick response can be made to the load fluctuation of the temperature controlled object, which further improves the accuracy of temperature control. For example, a pump may be provided to the first flow passage so as to control an amount of flow by increasing or decreasing the rotation speed of the pump.

The substrate processing apparatus according to the present invention may further comprise temperature detection means provided in the substrate processing part for detecting a temperature of the temperature controlled object in the first flow passage.

Thereby, a temperature of a predetermined part of a heating furnace, which is the temperature controlled object, is grasped accurately and can be controlled.

Additionally, in the substrate processing apparatus according to the present invention, the flow amount control means preferably controls an amount of flow of the first temperature control fluid based on information detected by the temperature detection means. Thereby, a most appropriate amount of flow of the first temperature control fluid can be made to a load fluctuation of the temperature controlled object, and a response becomes quick to the load fluctuation and waste of energy can be reduced while improving accuracy of the temperature control.

In the substrate processing apparatus according to the present invention, the first flow passage may include: an upstream passage in which the first temperature control fluid flows into the part of the flow passage; a downstream passage in which the first temperature control fluid flows out of the part of the flow passage; a bypass connecting the upstream passage and the downstream passage; and a heat exchange passage provided adjacent to the second flow passage to carry out heat-exchange with the second temperature control fluid, wherein the substrate processing apparatus may further comprise switch means for switching between a circulation passage of the first temperature control fluid comprising the upstream passage, the part of the flow passage, the downstream passage and the bypass and a circulation passage of the first temperature control fluid comprising the downstream passage and the heat exchange passage. The switch means may change a ratio of an amount of flow of the first temperature control fluid flowing through the circulation passage comprising the upstream passage, the part of the flow passage, the downstream passage and the bypass and an amount of flow of the first temperature control fluid flowing through the circulation passage comprising the upstream passage, the part of the flow passage, the downstream passage and the heat exchange passage to an arbitrary ratio. Thereby, since one of the route which passes through the heat exchanger and the route which does not pass through the heat exchanger but passes through the bypass can be selected, an optimum temperature control without waste of energy can be achieved with respect to a load fluctuation of the temperature controlled object.

Moreover, by circulating first cooling water using the route which does not pass through the heat exchange passage, a response becomes quicker than that of a case where a large load is generated, which reduces waste of energy while improving accuracy of the temperature control.

The substrate processing apparatus according to the present invention may comprise: temperature detection means provided in the substrate processing part for detecting a temperature of the temperature controlled object in the first flow passage; and means for controlling a switching operation of the switch means based on information detected by said temperature detection means. Thereby, the load fluctuation can be accurately grasped and a most appropriate route to the load fluctuation can be selected and a response to the load fluctuation becomes quick, which reduces waste of energy while improving accuracy of the temperature control.

The substrate processing apparatus according to the present invention may further comprise a heating mechanism heating the first temperature control fluid circulating through the upstream passage, the part of the flow passage, the downstream passage and the bypass. Thereby, only the first temperature control fluid, which does not pass through the heat exchange passage, that is, passes through the bypass, can be temperature-controlled. Consequently, if, for example, the temperature of the temperature controlled object is lower than a predetermined temperature, the temperature controlled object can be heated or temperature-controlled quickly to the predetermined temperature.

Thereby, the temperature of the temperature controlled object can be kept constant as much as possible.

Moreover, as compared to the case where the first temperature control fluid is heated or temperature-controlled, the energy efficiency becomes higher since the heating mechanism can heat or temperature-control the first temperature control fluid passing through the bypass.

In the substrate processing apparatus according to the present invention, the means for controlling the switching operation of the switch means may further include means for controlling a heating temperature of the heating mechanism based on the information detected by the temperature detection means. Thereby, the temperature control of the first temperature control fluid can be carried out further accurately. Therefore, the temperature of the temperature controlled object can be kept constant as much as possible.

Additionally, the substrate processing apparatus according to the present invention may further comprise a cooling mechanism cooling the first temperature control fluid flowing through the heat exchange passage. In the present invention, the first temperature control fluid is cooled to the predetermined temperature. When the temperature of the temperature controlled object is higher than the predetermined temperature, the temperature controlled object can be quickly cooled by the cooled first temperature control fluid passing through the heat exchange passage. Thereby, the temperature of the temperature controlled object can be kept constant as much as possible.

In the present invention, the heat exchange passage can be one through which the first temperature control fluid can circulate, and may be, for example, a tank or a pipe.

Additionally, there is provided according to another aspect of the present invention a temperature control device comprising: a first flow passage causing a first temperature control fluid to circulate, the first temperature control fluid for adjusting a temperature of a temperature controlled object; a second flow passage causing a second temperature control fluid to flow, the second temperature control fluid for exchanging heat with the first temperature control fluid; and flow amount control means for controlling an amount of flow of at least the second temperature control fluid.

In the present invention, the first flow passage which cools the temperature controlled object by, for example, the circulating first cooling water and a second flow passage separate from the first fluid passage are provided so as to exchange heat between the second cooling water flowing through the second flow passage and the first cooling heater. Thereby, there is no need to store the first cooling water in a tank of a constant capacity, and the first cooling water flowing through the first flow passage of a chiller corresponding part is absorbed substantially in its entirety by the second cooling water. Thereby, a response becomes quick with respect to a load fluctuation of the temperature controlled object, and waste of energy can be reduced while improving accuracy of temperature control.

Additionally, since the flow amount control means which controls an amount of flow of the second cooling water flowing through the second flow passage is provided, waste of energy can be avoided such as cooling on a chiller side and further heating at the same location to make the first cooling water of a predetermined temperature as in a conventional manner, and also it can be changed to an appropriate amount of flow with respect to a load fluctuation of the temperature controlled object and a response becomes quick with respect to the load fluctuation, which improves accuracy of temperature control.

In the temperature control device according to the present invention, the first flow passage preferably includes: a part of fluid passage arranged close to the temperature controlled object; an upstream passage in which the first temperature control fluid flows into the part of the flow passage; a downstream passage in which the first temperature control fluid flows out of the part of the flow passage; a bypass connecting the upstream passage and the downstream passage; and a heat exchange passage provided adjacent to the second flow passage to carry out heat exchange with the second temperature control fluid, wherein the temperature control device further comprises switch means for switching between a circulation passage of the first temperature control fluid comprising the upstream passage, the part of the flow passage, the downstream passage and the bypass and a circulation passage of the first temperature control fluid comprising the downstream passage and the heat exchange passage. The switch means may change a ratio of an amount of flow of the first temperature control fluid flowing through the circulation passage comprising the upstream passage, the part of the flow passage, the downstream passage and the bypass and an amount of flow of the first temperature control fluid flowing through the circulation passage comprising the upstream passage, the part of the flow passage, the downstream passage and the heat exchange passage to an arbitrary ratio. Thereby, since one of the route which passes through the heat exchange passage and the route which does not pass through the heat exchanger but passes through the bypass can be selected, an optimum temperature control without waste of energy can be achieved with respect to a load fluctuation of the temperature controlled object.

Moreover, by circulating first cooling water using the route which does not pass through the heat exchange passage, a response becomes quicker than that of a case where a large load is generated, which reduces waste of energy while improving accuracy of the temperature control.

The temperature control device according to the present invention may comprise: temperature detection means provided in a substrate processing part for detecting a temperature of the temperature controlled object in the first flow passage; and means for controlling a switching operation of the switch means based on information detected by the temperature detection means.

Additionally, the temperature control device according to the present invention may further comprise a heating mechanism heating the first temperature control fluid circulating through the upstream passage, the part of the flow passage, the downstream passage and the bypass.

Additionally, the means for controlling the switching operation of the switch means may further include means for controlling a heating temperature of the heating mechanism based on the information detected by the temperature detection means.

Further, it may further comprise a cooling mechanism cooling the first temperature control fluid flowing through the heat exchange passage.

Other objects, features and advantages of the present invention will become more apparent from the following detailed description when read in conjunction with the accompanying drawings.

BEST MODE FOR CARRYING OUT THE INVENTION

A description will be given below, with reference to the drawings, of embodiments of the present invention. It should be noted that although a temperature control of a CVD process part of a substrate processing apparatus will be explained in the present embodiment, the present invention is applicable to a temperature control other than CVD process part.

Figure 1:
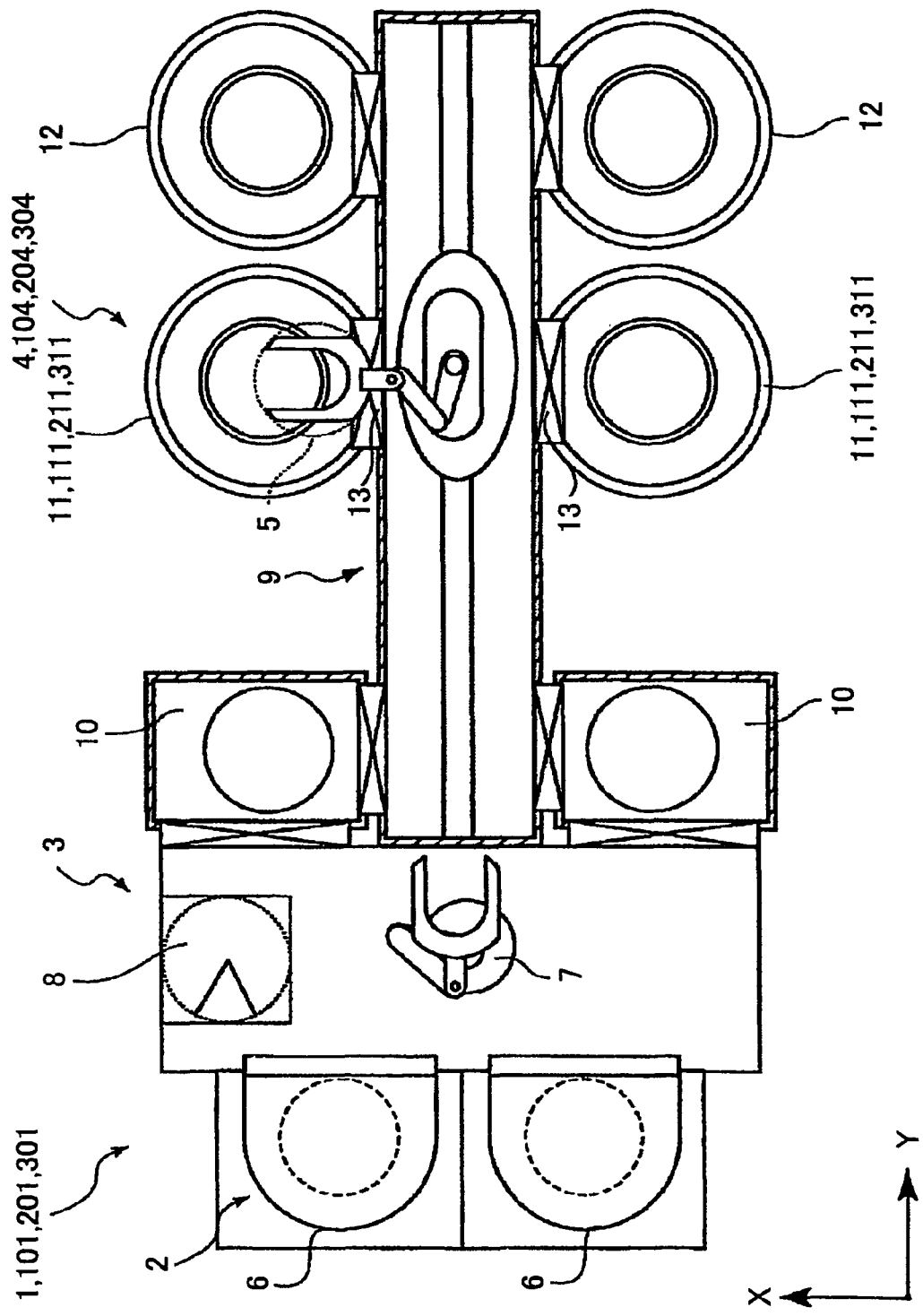
FIG. 1 is a diagramatic plan view showing a structure of a substrate processing apparatus according to a first embodiment of the present invention.
Figure 2:
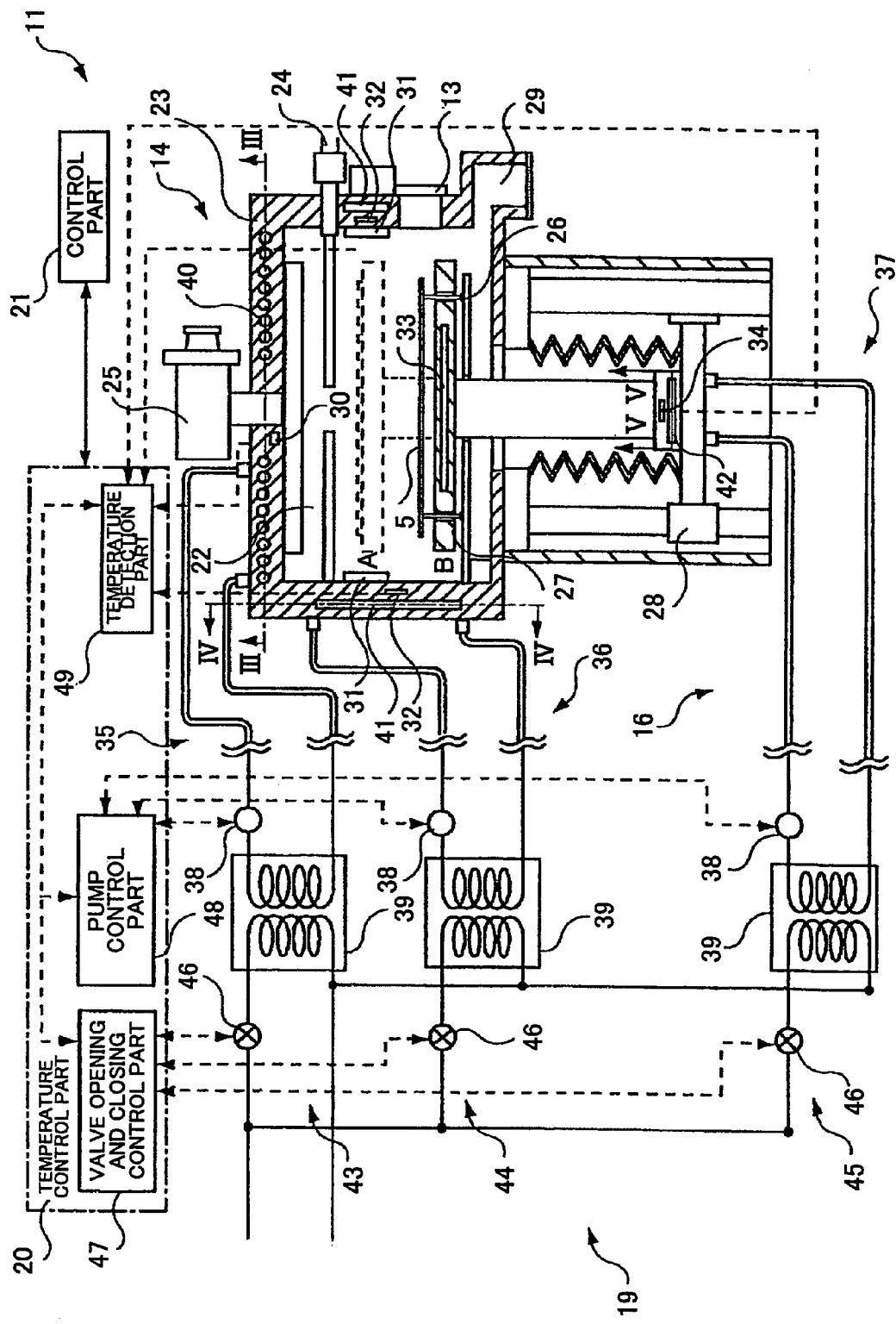
FIG. 2 is an explanatory diagram of a CVD process part according to the first embodiment of the present invention.
Figure 3:
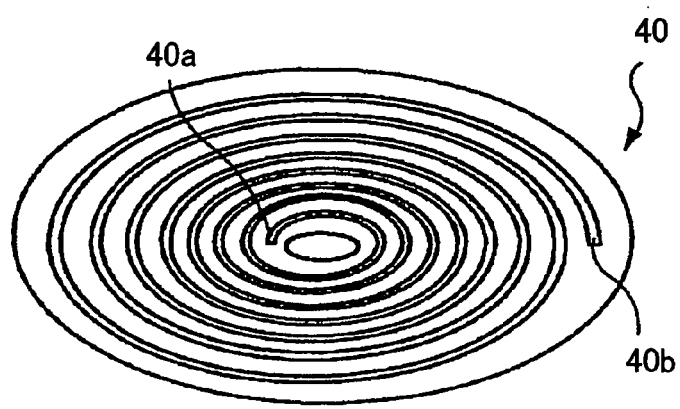
FIG. 3 is an explanatory diagram of a first flow passage formed in the CVD process part according to the first embodiment of the present invention.
Figure 4:
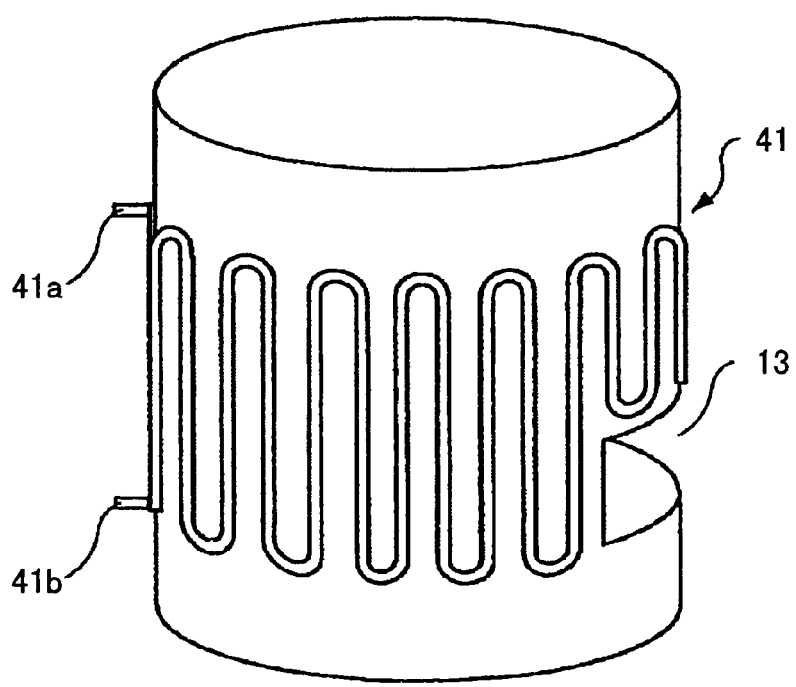
FIG. 4 is an explanatory diagram of a first flow passage formed in a body part of the CVD process part according to the first embodiment of the present invention.
Figure 5:
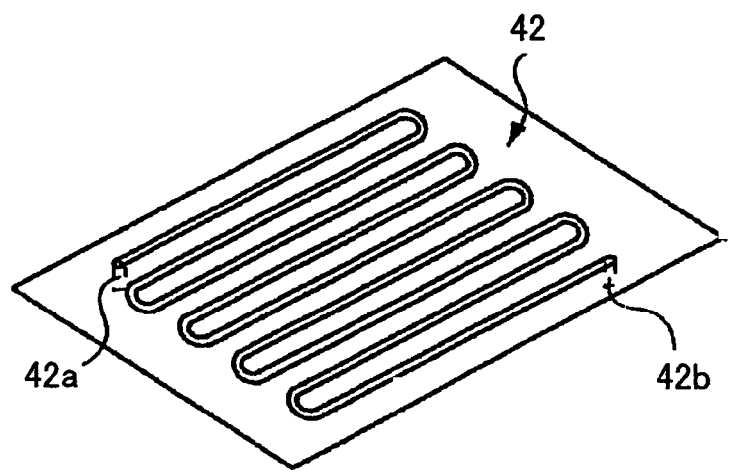
FIG. 5 is an explanatory diagram of a first flow passage formed in a lower part of the CVD process part according to the first embodiment of the present invention.
Figure 6:
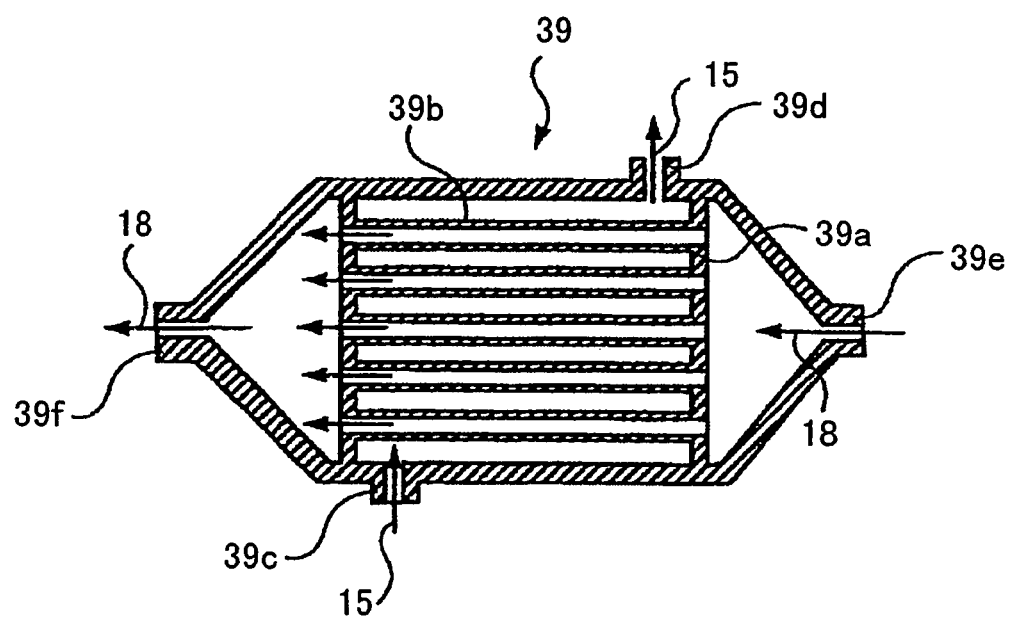
FIG. 6 is a cross-sectional view of a heat exchanger according to the first embodiment of the present invention, which performs heat exchange between a first temperature control fluid and a second temperature control fluid.
Figure 7:
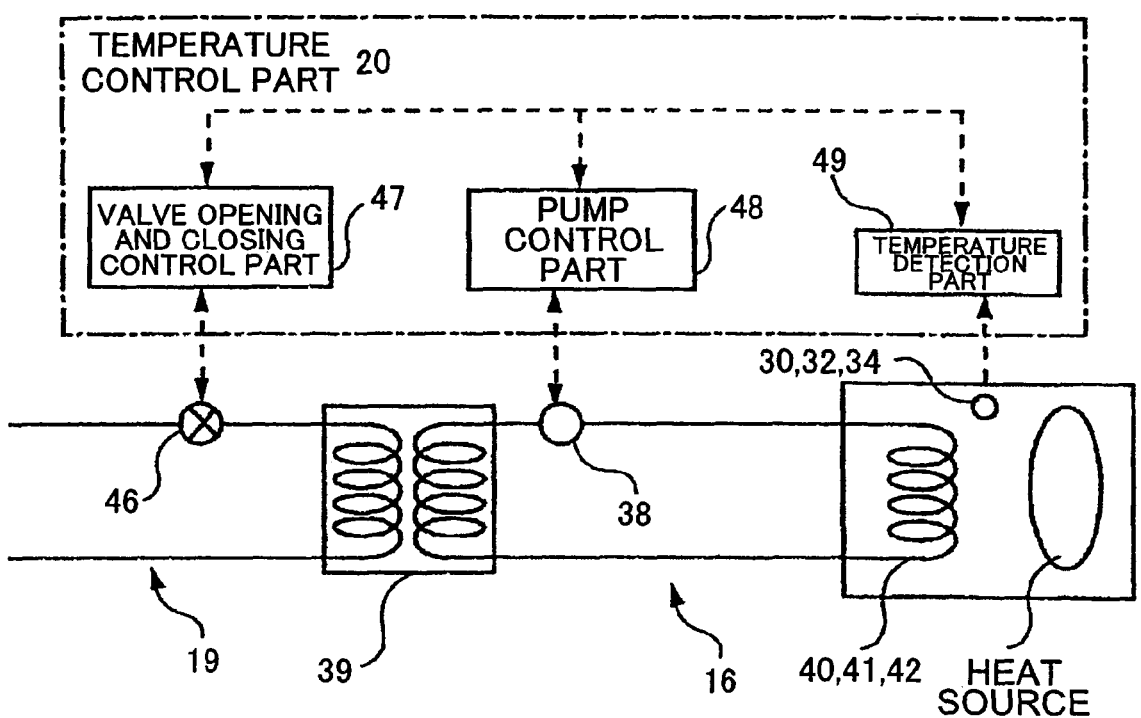
FIG. 7 is an explanatory diagram of a temperature control method of the CVD process part according to the first embodiment of the present invention.

FIG. 1 is a diagramatic plane view showing a structure of a substrate processing apparatus according to the first embodiment of the present invention. FIG. 2 is an explanatory diagram of a CVD process part of the substrate processing apparatus of FIG. 1. FIG. 3 is a perspective view of a first flow passage formed in an upper portion of the CVD process part taken along a line of FIG. 2. FIG. 4 is a perspective view of the first flow passage formed in a body part of the CVD process part taken along a line IV-IV of FIG. 2. FIG. 5 is a perspective view of the first flow passage formed in the body part of the CVD process part taken along a line V-V of FIG. 2. FIG. 6 is a cross-sectional view of a heat exchanger which exchanges heat between a first temperature control fluid and a second temperature control fluid. FIG. 7 is a diagram for explaining a temperature control method of the CVD process part.

As shown in FIG. 1, the substrate processing apparatus 1 is constituted by arranging a cassette placement stage 2, a conveyance chamber 3, a vacuum process part 4, etc., along a straight line in a direction of Y in FIG. 1. The cassette placement stage 2 is provided with two cassettes 6, each of which has airtightness such as FOUP (Front Opening Unified Pod) for accommodating, for example, 25 wafers 5 in multiple stages, aligned in a direction X in the figure. The conveyance chamber 3 has a wafer conveyance body 7 constituted by a multi-articulate robot and a pre-alignment stage 8. Formed in the vacuum process part 4 is a linear conveyance path 9 along the direction Y in the figure, and an end of the conveyance path 9 is adjacent to the conveyance chamber 3. Load lock chambers 10, CVD process parts 11 and etching process parts 12 are arranged along a longitudinal direction of the conveyance path 9 from the side of the conveyance chamber 3. The CVD process parts 11 and the etching process parts 12 are connected with the conveyance path 9 through gate valves 13.

Here, the CVD process part 11 comprises, as shown in FIG. 2, a processing part body 14 which CVD-processes the wafer 5, a first flow passage 16 through which a first temperature control fluid such as, for example, a first cooling water 15 circulates in the process part body 14, a second flow passage 19 through which a second cooling water 18, which is a second temperature control fluid, flows for exchanging heat with the first cooling water 15, a temperature control part 20 for controlling temperature regulation of those parts, a control part 21 for controlling the entire CVD process part 11, etc.

The process part body 14 comprises, as shown in FIG. 2, a housing 23 forming a process chamber 22 for CVD-processing the wafer 5, a gas introducing port 24 for introducing a gas into the process chamber 22, a microwave generation device 25 for generating a microwave, support pins 26 for supporting the wafer 5 which was carried into the process chamber 22 through the gate valve 13, a holding stage 27 for holding the wafer 5, which was carried in, when CVD-processing the wafer 5, a lifting device 28 for moving the holding stage 27 up and down, an exhaust port 29 for exhausting a gas in the process chamber 22, etc.

The housing 23 is provided with an upper part temperature sensor 30 near an upper cooling groove mentioned later in an upper part thereof which is close to the microwave generation device 25 as shown in FIG. 2. Additionally, a body part connecting to the upper part of the housing 23 is provided with a middle part heater 31 on an inner wall side of the process chamber 22 and a middle part temperature sensor 32 near the body part heater 31. Additionally, as shown in FIG. 2, a holding stage heater 33 is provided inside the holding stage 27, and a lower part temperature sensor 34 is provided in a lower part of the support column of the holding stage 27.

The first flow passage 16 has, as shown in FIG. 2, a body side upper flow passage 35 which circulates an upper part of the housing, a body side middle part flow passage 36 which circulates a middle part of the housing, and a body side lower part flow passage 37 which circulates a lower part of the housing. Each of the flow passages is provided with a pump 38 for circulating the first cooling water 15 and a heat exchanger 39 for exchanging heat with the second cooling water 18. Accordingly, each of the body side upper part flow passage 35, the body side middle part flow passage 36 and the body side lower part flow passage 37 is temperature-controllable independently.

In the body side upper part flow passage 35 inside the housing, an upper part cooling slot 40 is formed adjacent to the upper part temperature sensor 30. In the body side middle part flow passage 36, a middle part cooling slot 41 is formed outside the middle part heater 31. In the body side lower part flow passage 37, a lower part cooling slot 42 is formed adjacent to the lower part temperature sensor 34 of the lower support column of the holding stage 27.

Here, as shown in the FIG. 3, the upper part cooling slot 40 is formed in the shape of a swirl with the microwave generation apparatus 25 as a center thereof, and is connected to the first flow passage 16 outside the housing 23 at an inlet port 40a of a center side and an outlet port 40b of an outer side. Accordingly, the cooling water of a state of lowest temperature is circulated on the center side generating a largest amount of heat, and a high cooling efficiency is acquired. It should be noted that the upper part cooling slot 40 is not limited to the shape of a swirl, and may be formed, for example, in a generally wave shape such as the lower part cooling slot 42 mentioned later.

The middle part cooling slot 41 is formed in a generally wave shape so as to surround the middle part of the housing 23 while avoiding the gate valve 13 as shown in FIG. 4 (in FIG. 4, explained as not a slot itself but a pipe-like flow passage), and is connected to the first flow passage outside 16 the housing 23 at the inlet port 41a and the outlet port 41b. It should be noted that the middle part cooling slot 41 is not limited to the generally wave shape, and may be formed, for example, so as to spirally surround the middle part.

The lower part cooling slot 42 is formed by a slot, which is a part of the first flow passage 16, two-dimensionally in a generally wave shape in a lower part of the support column supporting the holding stage 27, and is connected with the first flow passage 16 outside the housing 23 at the inlet port 42a and the outlet port 42b. It should be noted that the lower part cooling slot 42 is not limited to the generally wave shape, and may be formed, for example, a shape of a swirl.

The heat exchanger 39 comprises, as shown in FIG. 6, two isolation walls which separate a space in which the first cooling water 15 flows and a space in which the second cooling water 18 flows, a heat exchange pipe 39b sandwiched by the isolation walls 39a, a second cooling water supply port 39e and a second cooling water discharge port 39f for the second cooling water 18 flowing inside the heat exchange pipe 39b, a first cooling water supply port 39c and a first cooling water discharge port 39d for the first cooling water 15 flowing a space surrounding the heat exchange pipe 39b, etc. Accordingly, heat exchange can be made between the first cooling water 15 flowing around the heat exchange pipe 39b and the second cooling water 18 flowing inside the heat exchange pipe 39b.

The second flow passage 19 comprises, as shown in FIG. 2, an upper part flow passage 43 corresponding to the body side upper part flow passage 35 in the heat exchanger 39, a middle part flow passage 44 corresponding to the body side middle part flow passage 36 in the heat exchanger 39, and a lower part flow passage 45 corresponding to the body side lower part flow passage 37 in the heat exchanger 39. Each of the flow passages is provided with a valve 46 in the middle thereof to control a flow. Accordingly, since the flow can be controlled for each flow passage, an optimum temperature control can be made in response to portions of the process chamber 22.

The second flow passage 19 includes, as shown in FIG. 2, a supply flow passage and a discharge flow passage of the second cooling water 18, and each of the supply flow passage and the discharge flow passage is connected to the valve 46 and the heat exchanger 39 by branching from a single flow passage. It should be noted that the second cooling water 18 of the supply flow passage may be, for example, a plant circulating water.

As shown in FIG. 2, the temperature control part 20 has a temperature detection part 49 which converts, under control of the control part 21, temperature information into electric signals and outputs it, under a control of the control part 21, to a valve opening and closing control part 47 and a pump control part 48, the temperature information from the temperature sensors in each part of the pump control part 48 which controls an operation of a pump of each of the flow passages of the first cooling water 15 and the process part body 14 such as, for example, an upper part temperature sensor 30, a middle part temperature sensor 32 and a lower part temperature sensor 34.

An amount of flow of the second cooling water 18 is determined based on the information of the temperature sensor of each part of the process part body 14 under a control of the control part 21. Each valve 46 is controlled by the valve opening and closing control part 47. Each pump 38 is controlled by a control of the pump control part 48. Accordingly, a most efficient and rapid temperature control can be made, which reduces a waste of energy.

Next, a description will be given of an operation of the substrate processing apparatus 1 constituted as mentioned above focusing on the temperature control of the CVD process part 11.

In the CVD process among substrate processes, as shown in FIG. 1 and FIG. 2, under a control of the control part 21, temperatures of the inside the process chamber 22 and the holding stage 27 are raised to predetermined temperatures by the middle part heater 31 and the holding stage heater 33. The wafer 5 carried into the process chamber 22 through the gate valve 13 of the CVD process part 11 by the wafer conveyance body 7 is placed on the support pins 26 protruding from a surface of the holding stage 27 that is moved down to a position B.

Thereafter the holding stage 27 is moved up to a predetermined position (position A in FIG. 2) by the lifting device 28. Since the support pins 26 do not move during the upward movement, the support pins 26 are taken away from the holding stage 27, and the wafer 5 is placed directly onto the holding stage 27 during the upward movement of the lifting device 28. Further, a predetermined gas is introduced into the process chamber 22 from the gas introducing port 24, and gas plasma is generated by the microwave generation apparatus 25, which results in the wafer 5 being CVD-processed.

It is the first cooling water 15 which controls a temperature of each part of the processing part body 14 to not being raised beyond a predetermined temperature.

As shown in FIG. 2 and FIG. 7, the upper part temperature sensor 30 arranged in the housing 23 near the microwave generation apparatus 25 is heated by a space inside the process chamber heat the microwave generation apparatus 25, which is one of the heat sources, at a high temperature, and transmits the temperature information to the temperature detection part 49 in the temperature control part 20. The temperature information is converted into the predetermined electric signal by the temperature detection part 49, and is output to the valve opening-and-closing control part 47 under a control of the control part 21.

The valve opening-and-closing control part 47 determines a degree of opening of the valve 46 in the second flow passage 19 by the input electric signal, and outputs the signal to the valve 46 so as to be, for example, further a predetermined degree of opening. The valve 46 is further opened by an attached valve opening-and-closing motor according to an instruction from the valve opening-and-closing part 47 so as to increase an amount of flow of the second cooling water 18 (for example, a plant circulating water) flowing through the second flow passage 19.

Thereby, as shown in the FIG. 6, an amount of flow of the second cooling water 18 supplied through the second cooling water supply port 39e of the heat exchanger 39 is increased, which increases an amount of heat exchange with the first cooling water 15 flowing around it through the heat exchange pipe 39b and further decreases the temperature of the first cooling water 15.

The temperature of the first cooling water 15, which is discharged from the first cooling water discharge port 39d of the heat exchanger 39, is decreased than that before the control by the temperature control part 20, and the first cooling water 15 is pressurized by the pump 38 so as to circulate in the first flow passage 16. As shown in FIG. 3, it flows into the housing 23 through the inlet port 40a of the upper cooling slot 40 formed in an upper part of the housing 23 of the process part body 14, and flows through the flow passage of a whirl shape. At this time, heat near the heated flow passage is taken into the first cooling water 15, which results in a decrease in the temperature of the housing 23 near the microwave generating apparatus 25, which is the temperature controlled object, to a predetermined temperature.

Further, the temperature of the first cooling water absorbing the heat is increased correspondingly, and discharged from the outlet port 40b of the upper cooling slot 40 and returns to the first cooling water 15 supply port 39c of the heat exchanger 39, cooled by the second cooling water 18 flowing in the heat exchanger 39 again, and circulates through the first flow passage 16.

It is also possible to control the pump 38 of the first flow passage 16 so as to change the amount of flow to carry out a temperature control. For example, if temperature information by the upper part temperature sensor 30 is converted into a predetermined electric signal by the temperature detection part 49 and is output to the pump control part 48 under the control of the control part 21, the pump control part 48 determines a degree of rotation speed of the pump 38 in the second flow passage 19 according to the input electric signal, and, for example, output a signal to the pump 38 so as to further increase the rotation speed to a predetermined rotation speed. Consequently, the pump 38 raises the rotation speed which results in an increase in the amount of flow of the first cooling water 15 circulating through the first flow passage 16.

Thereby, the first cooling water 15 flows with increased amount of flow through the whirl shaped passage, which is the upper part cooling slot 40 as compared to that before the control of the temperature control part 20 as shown in FIG. 3, and the temperature of the housing 23 near the microwave generation apparatus 25, which is a temperature controlled object, is decreased to a predetermined temperature.

Further, the first cooling water 15, which absorbed heat and increased in an amount of flow, is discharged from the outlet port 40b of the upper part cooling slot 40, returns to the first cooling water supply port 39c of the heat exchanger 39, cooled by the second cooling water 18 flowing in the heat exchanger 39 again, and then circulates through the first flow passage 16.

It should be noted that the control of the amount of flow of the first cooling water 15 circulating through the first flow passage 16 is not limited to the pump 38, and one of the same as the valve 46 of the second flow passage 19 and a control part the same as the valve opening and closing control part 47 may be provided, or a control may be carried out by the valve opening and closing control part 47 itself.

Moreover, it is possible to cause the pump control part 48 to control the rotation speed of the pump 38 by outputting an electric signal converted by the temperature detection part 49 to both the valve opening and closing control part 47 and the pump control part 48 so as to cause the valve opening and closing control part 47 to control a degree of opening of the valve 46 to perform a most efficient temperature control by mutual control of the valve opening and closing control part 47 and the pump control part 48.

Thus, according to the present embodiment, the first flow passage 16 for cooling the temperature controlled object by, for example, the circulating first cooling water 15 and the second flow passage 19 separate from the first flow passage 16 are provided so as to carry out heat exchange between the second cooling water 18 flowing through the second flow passage 19 and the first cooling water 15. Thus, there is no need to store the first cooling water 15 in a tank having a constant capacity, and the heat of the entire first cooling water 15 flowing through the first flow passage 16 is absorbed by the second cooling water 18 in a part corresponding to a chiller. Thereby, a response to a load fluctuation of the temperature controlled object is speeded up, and waste of energy can be reduced while improving the accuracy of the temperature control.

Moreover, since there is provided flow amount control means for controlling an amount of flow of the second cooling water 18 flowing through the second flow passage 19, the waste of the energy such as cooling by a chiller side like conventional way and further heating at the same location so as to make the first cooling water of a predetermined temperature can be avoided. Further, a change can be made to an appropriate amount of flow with respect to a load fluctuation of the temperature controlled object, a response to the load fluctuation of the temperature controlled object becomes quick, and an accuracy of the temperature control can be improved.

Furthermore, the flow amount control means includes flow amount control means for controlling an amount of flow of the second cooling water 18, which is the second temperature control fluid, based on information detected by the upper part temperature sensor 30, which is temperature detection means. Thus, a most appropriate flow amount of the second cooling water 18 with respect to a load fluctuation of the temperature controlled object can be achieved. Therefore, a response to the load fluctuation can be quick, and waste of energy can be reduced while improving an accuracy of the temperature control.

A description will now be given of a substrate processing apparatus according to a second embodiment of the present invention. It should be noted that the second embodiment differs from the first embodiment only in that a heater for temperature heating is added on the side of the temperature control and there are differences associated with that, and a description will be given focusing on the differences. Accordingly, in the following description, parts that are the same as the structural elements described in the first embodiment are give the same reference numerals, and descriptions thereof will be omitted.

Figure 8:
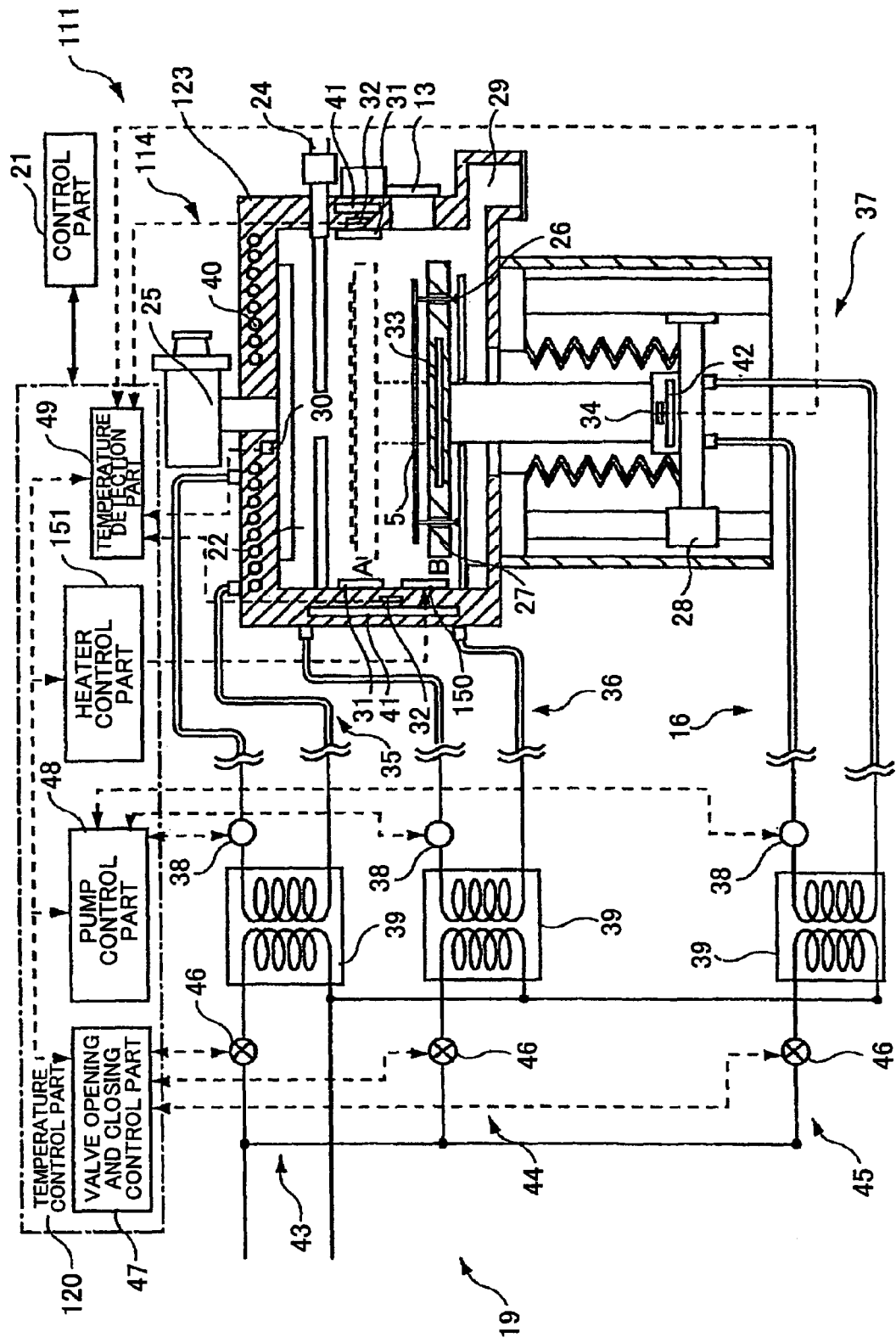
FIG. 8 is an explanatory diagram of a CVD process part having a heater for heating an apparatus according to a second embodiment of the present invention.
Figure 9:
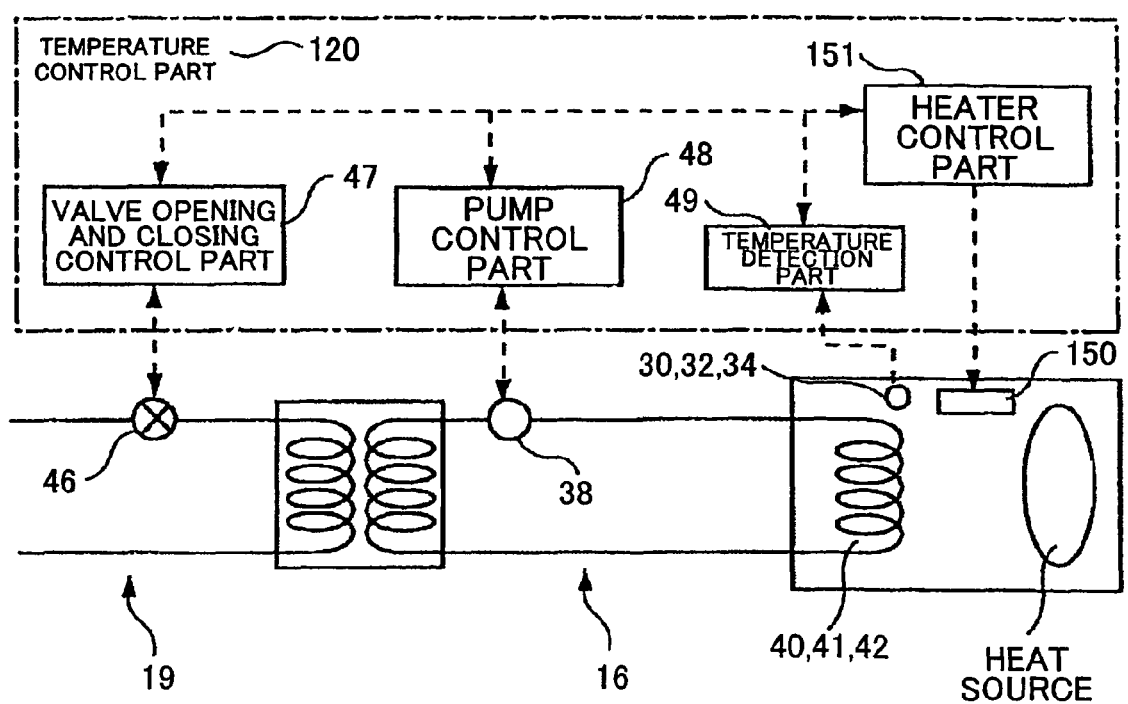
FIG. 9 is an explanatory diagram of a temperature control method of the CVD process part having the heater for heating an apparatus according to the second embodiment of the present invention.

FIG. 8 is a diagram for explaining a CVD process part of the substrate processing apparatus according to the second embodiment of the present invention. FIG. 9 is a diagram for explaining a temperature control of the CVD process part.

As shown in FIG. 1, the substrate processing apparatus 101 is constituted by the cassette placement stage 2, the conveyance chamber 3 and the vacuum process part 104 being arranged on a straight line in the Y direction in the figure.

A conveyance path 9 is formed in the vacuum process part 104 in the shape of a straight line along the Y direction in the figure, and an end part of the conveyance path 9 is adjacent to the conveyance chamber 3. Arranged on both sides of the conveyance path 9 are the load lock chambers 10, the CVD process parts 111 and the etching process parts 12 along the conveyance path 9 from the side of the conveyance chamber 3 along a longitudinal direction thereof. The CVD process parts 111 and the etching process parts 12 are connected with the conveyance path 9 through the gate valves 13.

Here, the CVD process part 111 comprises, as shown in FIG. 8, a process part body 114 which CVD-processes the wafer 5, the first flow passage 16 through which the first cooling water 15 which is the first temperature control fluid circulates in the process part body 114, the second flow passages 19 through which the second cooling water 18, which is the second temperature control fluid to carry out heat exchange with the first cooling water 15, flows, and the control part 21 which controls a temperature control part 120 controlling the temperature control thereof and the entire CVD process part 111.

The process part body 114 comprises, for example, as shown in FIG. 8, a housing 123 which forms a process chamber 22 which CVD-processes the wafer 5, a gas introducing port 24 which introduces a gas into the process chamber 22, a microwave generation apparatus 25 to generate a microwave, support pins 26 for supporting the wafer 5 carried in, a holding stage 27 which holds the wafer 5 when CVD-processing the wafer 5 carried in, a lifting device 28 for moving the holding stage 27 up and down, and an exhaust port 29 for exhausting a gas inside the process chamber 22 when cleaning the interior of the process chamber 22.

As shown in FIG. 8, an upper part temperature sensor 30 is provided adjacent to an upper cooling slot mentioned later in an upper part of the housing 23 adjacent to the microwave generation apparatus 25. A middle part heater 31 is provided on an inner wall side of the process chamber 22, and a heater 150 and a middle part temperature sensor 32 are provided adjacent to the middle part heater 31. By further providing the heater 150 for apparatus heating, the process chamber 22 can be heated, for example, with a smaller electric power preliminarily, which achieves energy conservation.

The temperature control part 120 comprises, as shown in FIG. 8, under the control of the control part 21, a valve opening and closing control part 47 which controls an amount of flow of the second cooling water 18 in the respective flow passages, a pump control part 48 which controls an operation of the pump 48 in each flow passage of the first cooling water 15, a temperature detection part 49 which converts temperature information from temperature sensors of each part of the process part body 14, that is, an upper part temperature sensor 30, a middle part temperature sensor 32 and a lower part temperature sensor 34, into electric signals and outputs them to the valve opening and closing part 47 and the pump control part 48 under the control of the control part 21, and a heater control part 151 which controls a temperature of the heater 150 for apparatus heating.

Thereby, an amount of flow of the second cooling water 18 is determined based on the information of the temperature sensor of each part of the process part body 14 under the control of the control part 21, each valve 46 is controlled by the control of the valve opening and closing control part 47, further each pump 38 is controlled by the control of pump control part 48, and thus, a most efficient and quick temperature control can be carried out, which reduces waste of energy.

Next, a description will be given of an operation of the substrate processing apparatus 101 constituted as mentioned above focusing on the temperature control of the CVD process part 111.

In the CVD process among substrate processes, as shown in FIG. 8 and FIG. 9, under the control of the control part 21, the temperature information from the middle part temperature sensor 32 to the temperature detection part 49 is converted into an electric signal by the temperature control part 120, and input to the heater control part 151. If the heater control part 151 determines by the electric signal that a predetermined temperature is already reached, pre-heating is not carried out.

On the other hand, if the heater control part 151 determines that the predetermined temperature has not been reached yet, and if it is an electric heater, the process chamber 22 is pre-heated by applying an electric power of 10 W, for example, to the heater 150 for apparatus heating. When carrying out the pre-heating by the heater 150 for apparatus heating, information indicating that an electric power of 10 W, for example, is input to the heater 150 for apparatus heating of the heater control part 151 is input to the pump control part 48. Accordingly, the pump control part 48 controls the pump 38 to stop rotation of the pump 38. Thereby, the first cooling water 15 circulates through the first flow passage 16, for example, the body side middle part flow passage 36, which avoids waste of energy due to a decrease in a temperature of the process chamber 22.

Next, if the heater control part 151 determined that the predetermined temperature is reached based on the electric signal from the temperature detection part 49, under the control of the control part 21, the inside of the process chamber 22 and the holding stage 27 are heated at a predetermined temperature by the middle part heater 31 of the CVD process part 111 and the holding stage heater 33. The wafer 5 carried into the process chamber 22 through the gate valve 13 of the CVD process part 111 by the wafer conveyance body 7 is placed on the support pins 26 protruding from a surface of the holding stage, which has been moved down to a position B.

After entering this process, the heater control part 151 stops application of the electric power to the heater 150 for apparatus heating, if necessary, according to information of a temperature condition of the process chamber 22 so as to stop the pre-heating. If it is determined that it exceeds the predetermined temperature in accordance with the input temperature information, the pump control part 48 sets a rotation speed of the pump 38 and causes pump 38 to rotate so as to circulate the first cooling water 15 through the first flow passage 16.

Thereafter, the holding stage 27 is moved up to a predetermined position (position A in FIG. 2) by the lifting device 28. Since the support pins 26 do not move during the movement of the holding stage 27, the support pins 26 are taken away from the holding stage 27, and the wafer 5 is placed directly on the holding stage 27 during the upward movement of the lifting device 28. Further, a predetermined gas is introduced into the process chamber 22 through the gas introducing port 24, gas plasma is generated by the microwave generation apparatus 25 so that the wafer 5 is CVD-processed.

The subsequent temperature control is the same as that of the first embodiment, and a description thereof will be omitted.

Thus, according to the present embodiment, the first flow passage 16, which cools the temperature controlled object by the circulating first cooling water 15, and the second flow passage 19 separate from the first flow passage 16 are provided so as to carry out heat exchange between the second cooling water 18 flowing through the second flow passage 19 and the first cooling water 15. Thus, there is no need to store the first cooling water 15 in a tank having a constant capacity, and the heat of the entire first cooling water 15 flowing through the first flow passage 16 is absorbed by the second cooling water 18 in a part corresponding to a chiller. Thereby, a response to a load fluctuation of the temperature controlled object is speeded up, and waste of energy can be reduced while improving the accuracy of the temperature control.

Moreover, since there is provided flow amount control means for controlling an amount of flow of the second cooling water 18 flowing through the second flow passage 19, the waste of the energy such as cooling by a chiller side like conventional way and further heating at the same location so as to make the first cooling water 15 of a predetermined temperature can be avoided. Additionally, a change can be made to an appropriate amount of flow with respect to a load fluctuation of the temperature controlled object, a response to the load fluctuation of the temperature controlled object becomes quick, and an accuracy of the temperature control can be improved.

Further, the flow amount control means includes flow amount control means for controlling an amount of flow of the second cooling water 18, which is the second temperature control fluid, based on information detected by the upper part temperature sensor 30, which is temperature detection means. Thus, a most appropriate flow amount of the second cooling water 18 with respect to a load fluctuation of the temperature controlled object can be achieved. Therefore, a response to the load fluctuation can be quick, and waste of energy can be reduced while improving an accuracy of the temperature control.

Additionally, the substrate processing apparatus 101 comprises the heater 150 for apparatus heating which preliminarily heats the process chamber 22 and the heater control part 151 which controls the temperature of the heater 150 for apparatus heating. Therefore, the process chamber 22 can be heated to a constant temperature with small energy beforehand, which reduces waste of energy.

Further, since the pump 38 in the first flow passage and the pump control part 48 to control an operation of the pump 38 are provided, waste of energy such that the temperature of the process chamber 22 is decreased by the first cooling water 15 circulating through the first flow passage 16 can be avoided.

Next, a description will be given of a substrate processing apparatus according to a third embodiment of the present invention. It should be noted that the third embodiment differs from the first embodiment only in that
a heat exchanger and a pump and a valve are provided in parallel in the first flow passage and the second flow passage and there are differences that associate with this structure, and a description will be focused on the differences. Accordingly, in the following description, parts that are the same as the structural elements described in the first embodiment are give the same reference numerals, and descriptions thereof will be omitted.

Figure 10:
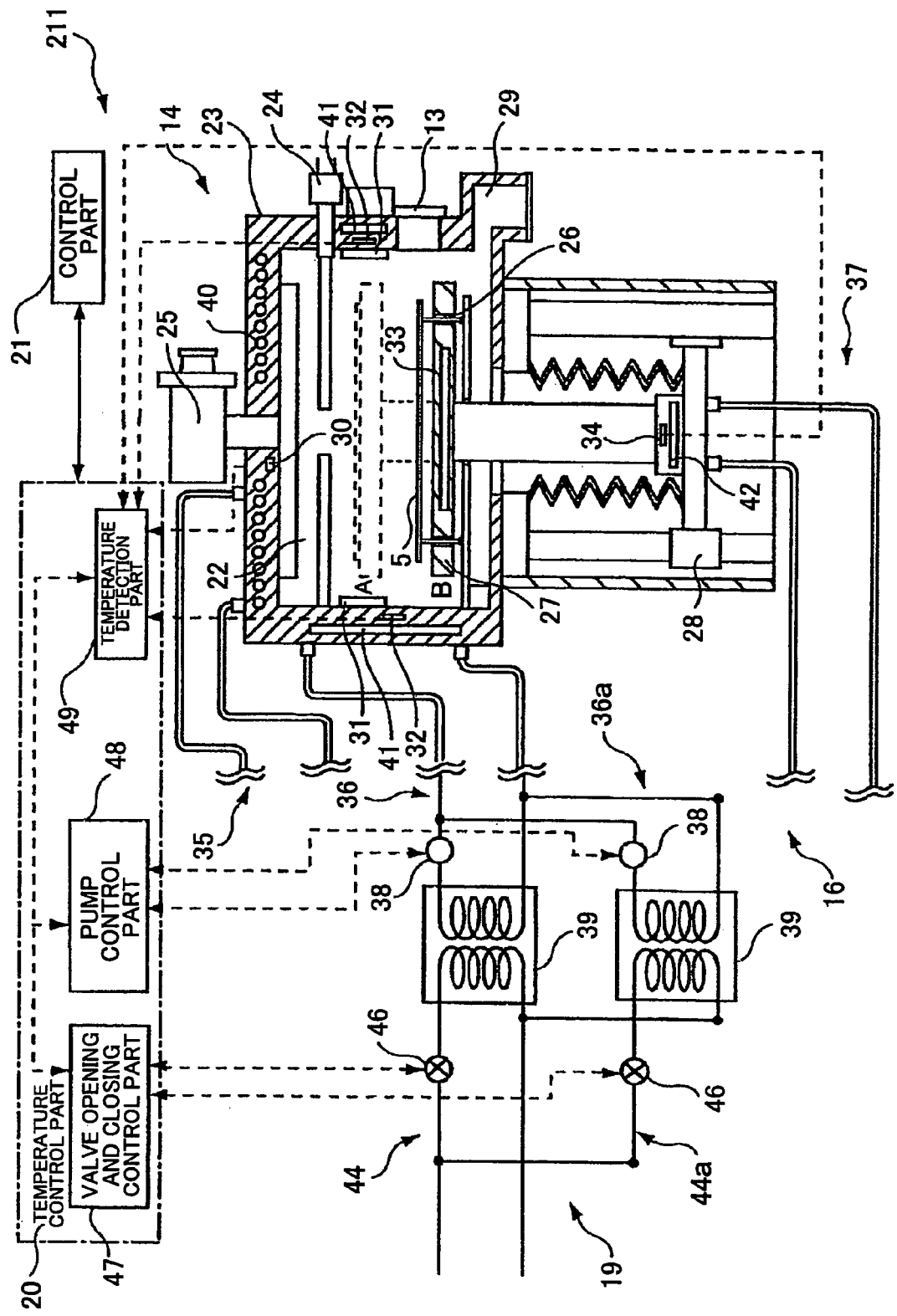
FIG. 10 is an explanatory diagram of the CVD process part provided with a heat exchanger according to a third embodiment of the present invention.

FIG. 10 is a diagram showing an outline structure of a CVD process part of the substrate processing apparatus according to the third embodiment of the present invention.

First, as shown in FIG. 1, the substrate processing apparatus 201 is constituted by the cassette placement stage 2, the conveyance chamber 3 and the vacuum process part 204 being arranged on a straight line in the Y direction in the figure. A conveyance path 9 is formed in the vacuum process part 204 in the shape of a straight line along the Y direction in the figure, and an end part of the conveyance path 9 is adjacent to the conveyance chamber 3. Arranged on both sides of the conveyance path 9 are the load lock chambers 10, the CVD process parts 211 and the etching process parts 12 along the conveyance path 9 from the side of the conveyance chamber 3 along a longitudinal direction thereof. The CVD process parts 211 and the etching process parts 12 are connected with the conveyance path 9 through the gate valves 13.

Here, the CVD process part 211 comprises, as shown in FIG. 10, a process part body 14 which CVD-processes the wafer 5, the first flow passage 16 through which the first cooling water 15 which is the first temperature control fluid circulates in the process part body 14, the second flow passages 19 through which the second cooling water 18, which is the second temperature control fluid to carry out heat exchange with the first cooling water 15, flows, and the control part 21 which controls a temperature control part 20 controlling the temperature control thereof and the entire CVD process part 211.

The first flow passage 16 has, as shown in FIG. 10, a body side upper flow passage 35 which circulates an upper part of the housing, a body side middle part flow passage 36 which circulates a middle part of the housing, and a body side lower part flow passage 37 which circulates a lower part of the housing. Each of the flow passages is provided with a pump 38 for circulating the first cooling water 15 and a heat exchanger 39 for exchanging heat with the second cooling water 18. Accordingly, each of the body side upper flow passage 35, the body side middle part flow passage 36 and the body side lower part flow passage 37 is temperature-controllable independently.

The second flow passage 19 comprises, as shown in FIG. 10, an upper part flow passage 43 corresponding to the body side upper part flow passage 35 in the heat exchanger 39, a middle part flow passage 44 corresponding to the body side middle part flow passage 36 in the heat exchanger 39, and a lower part flow passage 45 corresponding to the body side lower part flow passage 37 in the heat exchanger 39. Each of the flow passages is provided with a valve 46 in the middle thereof to control a flow. Accordingly, since the flow can be controlled for each flow passage, an optimum temperature control can be made in response to portions of the process chamber 22.

The second flow passage 19 includes, as shown in FIG. 10, a supply flow passage and a discharge flow passage of the second cooling water 18, and each of the supply flow passage and the discharge flow passage is connected to the valve 46 and the heat exchanger 39 by branching from a single flow passage. It should be noted that the second cooling water 18 of the supply flow passage may be, for example, a plant circulating water.

Moreover, as shown in FIG. 10, the first flow passage 16 branches between the pump 38 and the process part body 14 so as to form a main body side middle part flow passage 36a, and the pump 38 and the heat exchanger 39 are also provided in the main body side middle part flow passage 36a. Further, a middle part flow passage 44a is formed in the main body side middle part flow passage 36a as a corresponding bypass flow passage in the heat exchanger 39.

A valve 46 is provided to the middle flow passage 44a. a supply flow passage and a discharge flow passage of the middle part flow passage are connected to a supply flow passage and a discharge flow passage of the middle part flow passage 44 at positions opposite to the heat exchanger 39, respectively.

Thereby, the first flow passage 16 and the second flow passage 19 are formed in double parallel from the valve 46 to the heat exchanger 39 and the pump 38 so that an amount of heat exchange by the first flow passage 16 in the process part body 14 can be doubled. Moreover, if a cooling capacity to the extent that the two heat exchangers must be used is not needed, useless cooling can be prevented and the waste of energy can be avoided by not using, for example, the main body side middle part flow passage 36a and the middle part flow passage 44a.

Next, a description will be given of an operation of the substrate processing apparatus 201 constituted as mentioned above focusing on the temperature control of the CVD process part 211.

In the CVD process among substrate processes, as shown in FIG. 1 and FIG. 10, under a control of the control part 21, temperatures of the inside the process chamber 22 and the holding stage 27 are raised to predetermined temperatures by the middle part heater 31 and the holding stage heater 33. The wafer 5 carried into the process chamber 22 through the gate valve 13 of the CVD process part 211 by the wafer conveyance body 7 is placed on the support pins 26 protruding from a surface of the holding stage 27 that is moved down to a position B.

Thereafter the holding stage 27 is moved up to a predetermined position (position A in FIG. 2) by the lifting device 28. Since the support pins 26 do not move during the upward movement, the support pins 26 are taken away from the holding stage 27, and the wafer 5 is placed directly onto the holding stage 27 during the upward movement of the lifting device 28. Further, a predetermined gas is introduced into the process chamber 22 from the gas introducing port 24, and gas plasma is generated by the microwave generation apparatus 25, which results in the wafer 5 being CVD-processed.

It is the first cooling water 15 which controls a temperature of each part of the process part body 14 to not being raised beyond a predetermined temperature.

As shown in FIG. 2 and FIG. 10, the upper part temperature sensor 30 arranged in the housing 23 near the microwave generation apparatus 25 is heated by a space inside the process chamber 22 near the microwave generation apparatus 25, which is one of heat sources, at a high temperature, and transmits the temperature information to the temperature detection part 49 in the temperature control part 20. The temperature information is converted into the predetermined electric signal by the temperature detection part 49, and is output to the valve opening and closing control part 47 under a control of the control part 21.

The valve opening and closing control part 47 determines whether to use simultaneously, for example, the body side middle part flow passage 36a with the main body side middle part flow passage 36 in accordance with the input electric signal. If it is determined that the main body side middle part flow passage 36a is used simultaneously, the valve opening and closing control part 47 determines a degree of opening of the valve 46 in the second flow passage 19 by the input electric signal, and outputs the signal to the valve 46 so as to be, for example, further a predetermined degree of opening.

The valve 46 is further opened by an attached valve opening-and-closing motor according to an instruction from the valve opening-and-closing part 47 so as to increase an amount of flow of the second cooling water 18 (for example, a plant circulating water) flowing through the second flow passage 19. Thereby, as shown in the FIG. 6, an amount of flow of the second cooling water 18 supplied through the second cooling water supply port 39e of the heat exchanger 39 is increased, which increases an amount of heat exchange with the first cooling water 15 flowing around it through the heat exchange pipe 39b and further decreases the temperature of the first cooling water 15.

The temperature of the first cooling water 15, which is discharged from the first cooling water discharge port 39d of the heat exchanger 39, is decreased than that before the control by the temperature control part 20, and the first cooling water 15 is pressurized by the pump 38 so as to circulate in the first low passage 16.

Additionally, as shown in FIG. 4, the first cooling water 15 flows into the housing 23 through the inlet port 41a of the middle part cooling slot 41 formed in an upper part of the housing 23 of the process part body 14, and flows through the flow passage of a generally wave shape. At this time, heat near the heated flow passage is taken into the first cooling water 15, which results in a decrease in the temperature of the housing 23 near the middle part heater 31, which is the temperature controlled object, to a predetermined temperature.

Further, the temperature of the first cooling water 15 absorbing the heat is increased correspondingly, and discharged from the outlet port 41b of the middle part cooling slot 41 and returns to the first cooling water supply port 39c of the heat exchanger 39, cooled by the second cooling water 18 flowing in the heat exchanger 39 again, and circulates through the body side middle part flow passage 36 and the main body side middle part flow passage 36a, which are the first flow passage 16.

It is also possible to control the pump 38 of the body side middle part flow passage 36 and the main body side middle part flow passage 36a, which are the first flow passage 16, so as to change the amount of flow to carry out a temperature control.

For example, if temperature information by the upper part temperature sensor 30 is converted into a predetermined electric signal by the temperature detection part 49 and is output to the pump control part 48 under the control of the control part 21, the pump control part 48 determines whether to use the middle part flow passage 44a simultaneously with the middle part flow passage 44 in accordance with the input electric signal. If it is determined that the middle part flow passage 44a is used simultaneously, the pump control part 48 determines a degree of rotation speed of the pump 38, and outputs to the pump 38 so as to further increase the rotation speed to a predetermined rotation speed. Consequently, the pump 38 raises the rotation speed which results in an increase in the amount of flow of the first cooling water 15 circulating through the body side middle part flow passage 36 and the main body side middle part flow passage 36a, which are the first flow passage 16.

Thereby, the first cooling water 15 flows with increased amount of flow through the generally wave shaped passage, which is the upper part cooling slot 40, as compared to that before the control of the temperature control part 20 as shown in FIG. 4. Thus, more heat near the heated flow passage is taken into the first cooling water 15, and the temperature of the housing 23 near the middle part heater 31, which is a temperature controlled object, is decreased to a predetermined temperature.

Further, the first cooling water 15, which absorbed heat and increased in an amount of flow, is discharged from the outlet port 40b of the upper part cooling slot 40, returns to the first cooling water supply port 39c of the heat exchanger 39, cooled by the second cooling water 18 flowing in the heat exchanger 39 again, and the circulates through the body side middle part flow passage 36 and the main body side middle part flow passage 36a, which are the first flow passage 16.

It should be noted that the control of the amount of flow of the first cooling water 15 circulating through the body side middle part flow passage 36 and the main body side middle part flow passage 36a is not limited to the pump 38, and one of the same as the valve 46 of the second flow passage 19 and a control part the same as the valve opening and closing control part 47 may be provided, or a control may be carried out by the valve opening and closing control part 47 itself.

Moreover, it is possible to cause the pump control part 48 to control the rotation speed of the pump 38 by outputting an electric signal converted by the temperature detection part 49 to both the valve opening and closing control part 47 and the pump control part 48 so as to cause the valve opening and closing control part 47 to control a degree of opening of the valve 46 to perform a most efficient temperature control by mutual control of the valve opening and closing control part 47 and the pump control part 48.

Thus, according to the present embodiment, the first flow passage 16 for cooling the temperature controlled object by, for example, the circulating first cooling water 15 and the second flow passage 19 separate from the first flow passage 16 are provided so as to carry out heat exchange between the second cooling water 18 flowing through the second flow passage 19 and the first cooling water 15. Thus, there is no need to store the first cooling water 15 in a tank having a constant capacity, and the heat of the entire first cooling water 15 flowing through the first flow passage 16 is absorbed by the second cooling water 18 in a part corresponding to a chiller. Thereby, a response to a load fluctuation of the temperature controlled object is speeded up, and waste of energy can be reduced while improving the accuracy of the temperature control.

Moreover, since there is provided flow amount control means for controlling an amount of flow of the second cooling water 18 flowing through the second flow passage 19, the waste of energy such as cooling by a chiller side like conventional way and further heating at the same location so as to make the first cooling water 15 of a predetermined temperature can be avoided. Further, a change can be made to an appropriate amount of flow with respect to a load fluctuation of the temperature controlled object, a response to the load fluctuation of the temperature controlled object becomes quick, and an accuracy of the temperature control can be improved.

Furthermore, the flow amount control means includes flow amount control means for controlling an amount of flow of the second cooling water 18, which is the second temperature control fluid, based on information detected by the upper part temperature sensor 30, which is a temperature detection means. Thus, a most appropriate flow amount of the second cooling water 18 with respect to a load fluctuation of the temperature controlled object can be achieved. Therefore, a response to the load fluctuation can be quick, and waste of energy can be reduced while improving an accuracy of the temperature control.

Additionally, since the first flow passage 16 and the second flow passage 19 are formed in double parallel from the valve 46 to the heat exchanger 39 and the pump 38, an amount of heat exchange by the first flow passage 16 in the process part body 14 can be doubled. Additionally, if a cooling capacity is not needed so much, useless cooling can be prevented and wasted energy can be avoided by not using the main body side middle part flow passage 36a and the middle part flow passage 44a.

A description will now be given of a substrate processing apparatus according to a fourth embodiment of the present invention. It should be noted that the fourth embodiment differs from the first embodiment only in that switch valves and bypasses are provided in the first flow passage and there are differences associated with that, and a description will be given focusing on the differences. Accordingly, in the following description, parts that are the same as the structural elements described in the first embodiment are give the same reference numerals, and descriptions thereof will be omitted.

Figure 11:
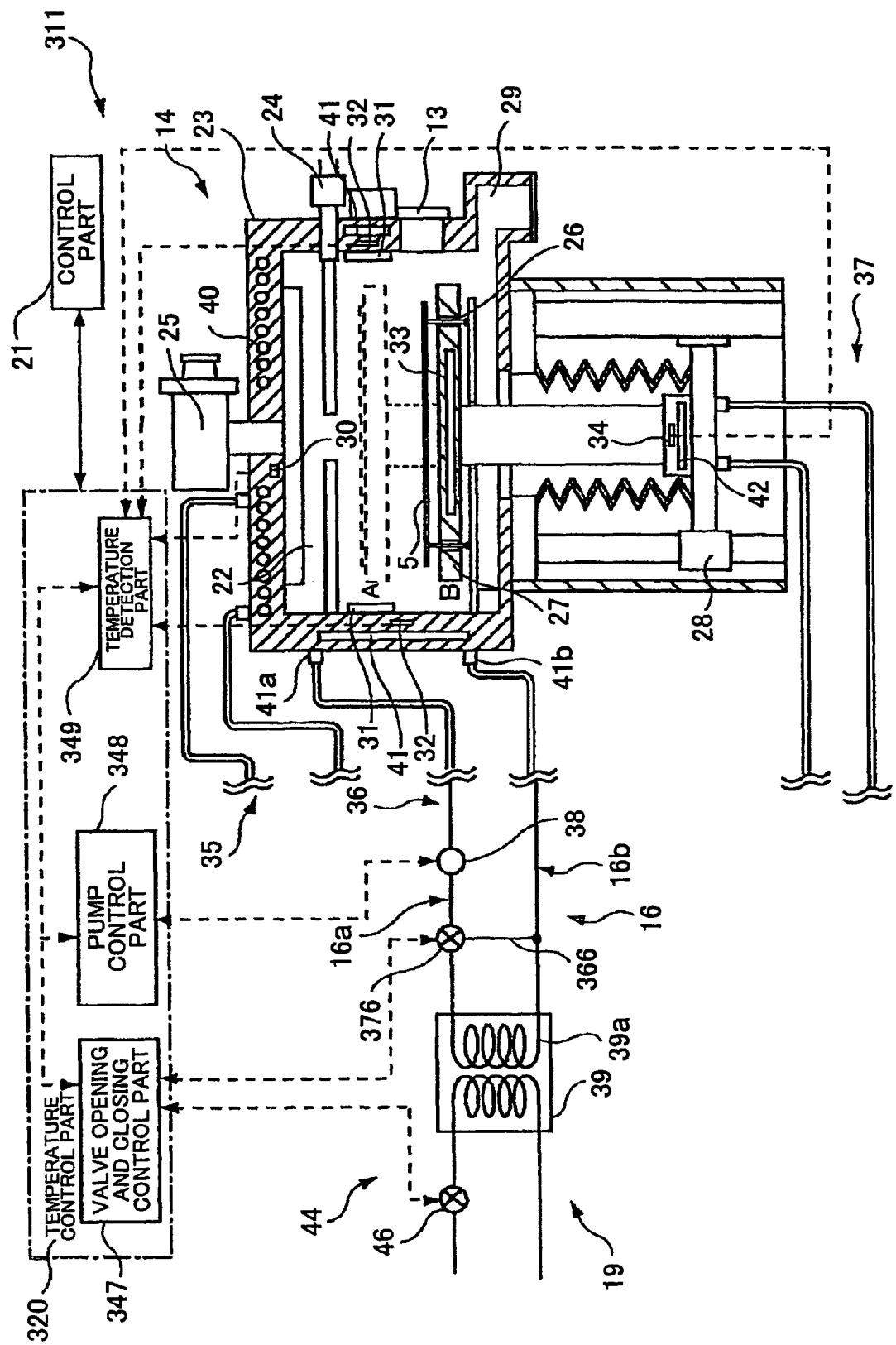
FIG. 11 is an explanatory diagram of the CVD process part provided with a bypass according to a fourth embodiment of the present invention.
Figure 12:
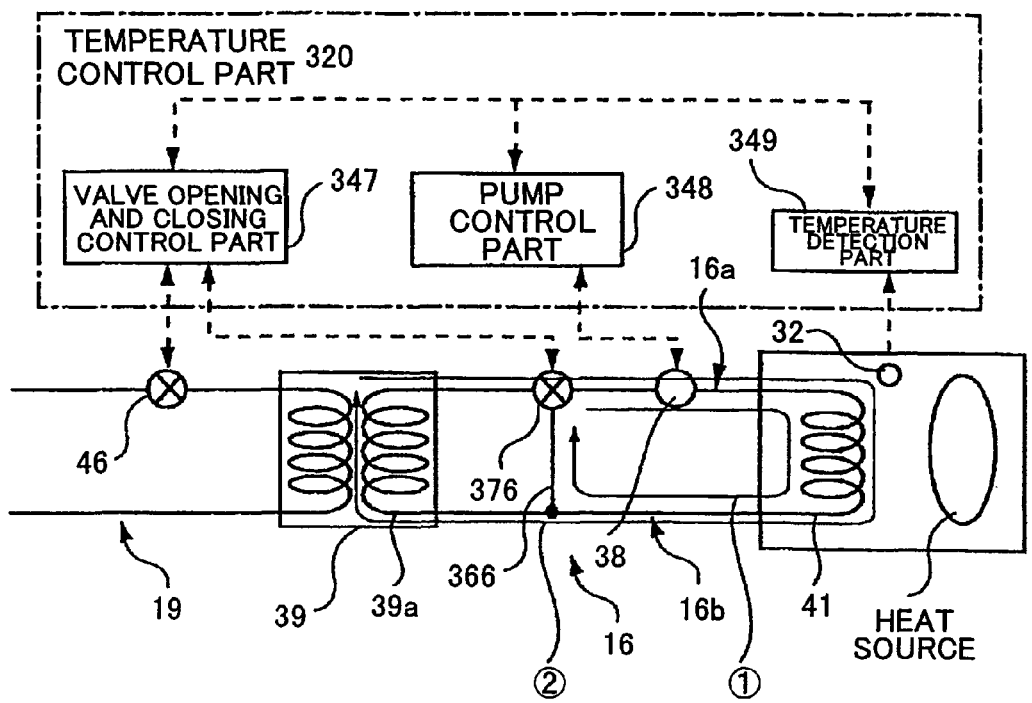
FIG. 12 is an explanatory diagram of a case where a pump according to a fourth embodiment of the present invention is on a body side with respect to the bypass.
Figure 13:
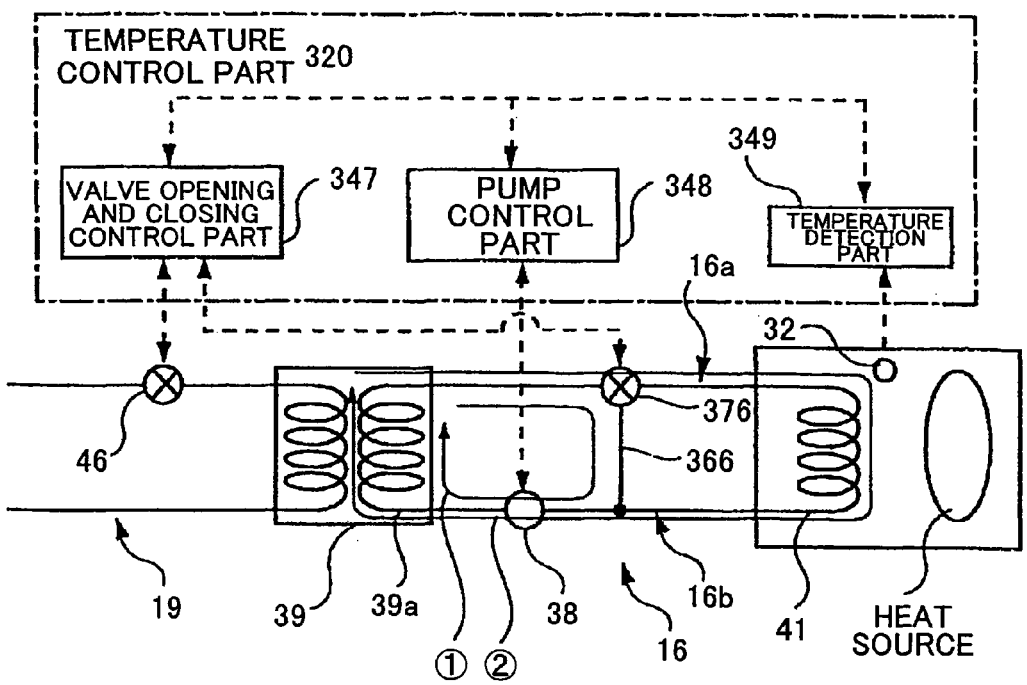
FIG. 13 is an explanatory diagram of a case where a pump according to the fourth embodiment of the present invention is on a heat exchanger side with respect to the bypass.

FIG. 11 is a diagramatic explanatory view of a CVD process part of a substrate processing apparatus according to the fourth embodiment of the present invention. FIG. 12 is an explanatory diagram of a case where a pump is on a body side with respect to a bypass. FIG. 13 is an explanatory diagram of a case where a pump is on a heat exchanger side with respect to the bypass.

As shown in FIG. 1, the substrate processing apparatus 301 is constituted by the cassette placement stage 2, the conveyance chamber 3 and the vacuum process part 304 being arranged on a straight line in the Y direction in the figure.

A conveyance path 9 is formed in the vacuum process part 304 in the shape of a straight line along the Y direction in the figure, and an end part of the conveyance path 9 is adjacent to the conveyance chamber 3. Arranged on both sides of the conveyance path 9 are the load lock chambers 10, the CVD process parts 311 and the etching process parts 12 along the conveyance path 9 from the side of the conveyance chamber 3 along a longitudinal direction thereof. The CVD process parts 311 and the etching process parts 12 are connected with the conveyance path 9 through the gate valves 13.

Here, the CVD process part 311 comprises, as shown in FIG. 11, a process part body 14 which CVD-processes the wafer 5, the first flow passage 16 through which the first cooling water 15 which is the first temperature control fluid circulates in the process part body 14, the second flow passages 19 through which the second cooling water 18, which is the second temperature control fluid to carry out heat exchange with the first cooling water 15, flows, and the control part 21 which controls a temperature control part 320 controlling the temperature control thereof and the entire CVD process part 311.

The first flow passage 16 comprises the body side upper part flow passage 35 circulating an upper part of the housing, a body side middle part flow passage 36 circulating a middle part of the housing, and a body side lower part flow passage 37 circulating a lower part of the housing. The body side middle part flow passage 36 comprises, as shown in FIG. 11, an upstream passage 16a connected to the outlet port 41a of the middle part cooling slot 41, a downstream passage 16b connected to the outlet port 41b of the middle part cooling slot 41, and a heat exchanger 39 heat-exchanging with the second cooling water 18.

A middle part bypass 366 is provided, as shown in FIG. 11 and FIG. 12, as a third flow passage between the upstream passage 16a and the downstream passage 16b. A middle part switch valve 376 is provided at a converging point of the middle part bypass 366 and the upstream passage 16a, the switch valve 376 switching between flowing the first cooling water 15 from the heat exchanger 39 to the inlet port 41a of the middle part cooling slot 41 and flowing the first cooling water 15 which has returned from the middle part bypass 366.

Additionally, the upstream passage 16a is provided with, as shown in FIG. 11 and FIG. 12, a pump 38 for circulating the first cooling water 15 between the middle part switch valve 376 and the inlet port 41a of the middle part cooling slot 41. It should be noted that although only the body side middle part flow passage 36 is shown in FIG. 11, the upstream passage 16a, the downstream passage 16b and the heat exchanger 39 may be provided to other flow passages as well. Thereby, the body side upper part flow passage 35, the body side middle part flow passage 36 and the body side lower part flow passage 37 are controllable independently.

Further, the second flow passage 19 comprises, as shown in FIG. 11, a middle part flow passage 44 corresponding to the body side middle part flow passage 36 in the heat exchanger 39 and a valve 46 for controlling an amount of flow in the middle part flow passage 44. It should be noted that, similar to the first flow passage 16, an upper part flow passage, a lower part flow passage and valves for each can be provided in other flow passages. Accordingly, since the flow can be controlled for each flow passage, an optimum temperature control can be made in response to portions of the process chamber 22.

As shown in FIG. 11 and FIG. 12, the temperature control part 320 comprises a valve opening and closing control part 347 which controls, under the control of the control part 21, switching of the flow passages of the first cooling water 15 and an amount of flow of the second cooling water 18, a pump control part 348 which controls an operation of the pump 38 in the flow passage of the first cooling water 15, and a temperature detection part 349 which converts temperature information, which is from each part of the process part body 14 such as, for example, the middle part temperature sensor 32 into electric signals and outputs it to the valve opening and closing control part 347 and the pump control part 348 under the control of the control part 21.

Thereby, an amount of flow of the second cooling water 18 and the flow passage to which the first cooling water 15 flows are determined based on the information of the temperature sensor of each part of the process part body 14 under a control of the control part 21. The valve 46 and the middle part switch valve 376 are controlled by the control of the valve opening and closing control part 347, and, further, the pump 38 is controlled by the control of the pump control part 348. Accordingly, a most efficient and rapid temperature control can be made, which reduces a waste of energy.

Next, a description will be given of an operation of the substrate processing apparatus 301 constituted as mentioned above focusing on the temperature control of the CVD process part 311.

In the CVD process among substrate processes, as shown in FIG. 1 and FIG. 11, under a control of the control part 21, temperatures of the inside of the process chamber 22 and the holding stage 27 are raised to predetermined temperatures by the middle part heater 31 and the holding stage heater 33. The wafer 5 carried into the process chamber 22 through the gate valve 13 of the CVD process part 311 by the wafer conveyance body 7 is placed on the support pins 26 protruding from a surface of the holding stage 27 that is moved down to a position B.

Thereafter the holding stage 27 is moved up to a predetermined position (position A in FIG. 11) by the lifting device 28. Since the support pins 26 do not move during the upward movement, the support pins 26 are taken away from the holding stage 27, and the wafer 5 is placed directly onto the holding stage 27 during the upward movement of the lifting device 28. Further, a predetermined gas is introduced into the process chamber 22 from the gas introducing port 24, and gas plasma is generated by the microwave generation apparatus 25, which results in the wafer 5 being CVD-processed.

It is the first cooling water 15 which controls a temperature of each part of the process part body 14 to not being raised beyond a predetermined temperature.

As shown in FIG. 2 and FIG. 11, the middle part temperature sensor 32 arranged in the housing 23 is heated by a space inside the process chamber 22 near the microwave generation apparatus 25, which is one of the heat sources, at a high temperature, and transmits the temperature information to the temperature detection part 349 in the temperature control part 320. The temperature information is converted into the predetermined electric signal by the temperature detection part 349, and is output to the valve opening and closing control part 347 under a control of the control part 21.

The control part 21 determines whether to cause the first cooling water 15 flowing through the middle part cooling slot 41 to circulate through the middle part bypass 366 without passing through the heat exchanger 39 or circulate through the heat exchange passage 39a of the heat exchanger 39 without using the middle part bypass 366 in accordance with the electric signal input to the valve opening and closing control part 347.

If the valve opening and closing control part 347 determines that the circulation is made, for example, through the heat exchanger 39 without using the middle part bypass 366, a signal is output to the middle part switch valve 376 to close the flow passage to the middle part bypass 366 and open the flow passage between the heat exchange passage 39a and the pump 38. The middle part switch valve 376 closes the flow passage to the middle part bypass 366 according to the command from the valve opening and closing control part 347, and opens the flow passage between the heat exchange passage 39a and the pump 38. Additionally, the middle part switch valve 376 can also adjust a ratio of an amount of flow of the first cooling water 15 flowing through the middle part bypass 366 and an amount of flow of the first cooling water 15 flowing through the flow passage between the heat exchange passage 39a and the pump 38 to an arbitrary ratio by partially closing the flow passage to the middle part bypass 366 and partially opening the flow passage between the heat exchange passage 39a and the pump 38. That is, by controlling the middle part switch valve 376, the ratio of the amount of flow of the first cooling water 15 flowing through the middle part bypass 366 and the amount of flow of the first cooling water 15 flowing through the flow passage between the heat exchange passage 39a and the pump 38 can be adjusted. If the valve opening and closing control part 347 determines that the circulation is made through the middle part bypass 366 without using the heat exchange passage 39a, a signal is output to close the flow passage to the heat exchange passage 39a and open the flow passage between the middle part bypass 366 and the pump 38.

For example, as shown in FIG. 12, before the temperature of the heat source rises, the inside of the middle part cooling slot 41 is made to be a uniform temperature by circulating the cooling water by the pump 38 using a loop of {circle around (1)}. That is, if an operation of the pump 38 is constant, an entire amount of the cooling water in the loop of {circle around (1)} is smaller and a fluid velocity is larger than that of a loop {circle around (2)}. If the fluid velocity becomes larger, a temperature difference between the inlet port 41a and the outlet port 41b of the middle part cooling slot 41 can be minimized to the utmost. Thereby, the temperature inside the middle part cooling slot 41 can be maintained uniform.

If the temperature of the heat source rises, the middle part bypass 366 is closed by the middle part switch valve 376 so as to circulate the cooling water by the pump 38 using the loop of {circle around (2)}). Thereby, the cooling water from the heat exchanger 39 is lead inside the middle part cooling slot 41 so that the interior of the middle part cooling slot 41 is adjusted immediately to an appropriate temperature.

Thus, by switching from the loop of {circle around (1)} to the loop of {circle around (2)}, quick cooling can be achieved even if a thermal fluctuation of the heat source is large. Moreover, since an amount of the cooling water can be reduced using the loop of {circle around (1)} if the thermal fluctuation is small, energy conservation can be achieved as compared to the case where the cooling water is circulated always according to the loop of {circle around (2)}.

Moreover, the electric signal converted by the temperature detection part 349 may be output to both the valve opening and closing control part 347 and the pump control part 348 so as to carry out a most efficient temperature control by mutual control of the valve opening and closing control part 347 and the pump control part 348 under the control of the control part 21. That is, is it possible to cause the valve opening and closing control part 347 to control a degree of opening of the valve 46 and the switching of each flow passage by the middle part switch valve 376 and also cause the pump control part 348 to control a rotation speed of the pump 38 by mutual control of the valve opening and closing control part 347.

Moreover, as shown in FIG. 13, the pump 38 is provided in the downstream passage 16b, and the middle part bypass 366 is provided between the pump 38 and the outlet port 41b of middle part cooling slot 41 so that the first cooling water 15 flows in from the upstream passage 16a. The middle part switch valve 376 may be provided at the converging point of the middle part bypass 366 and the upstream passage 16a, the middle part switch valve 376 switching the direction flow of the first cooling water 15 from the heat exchanger 39 between the inlet port 41a of the middle part cooling slot 41 and the middle part bypass 366.

In the apparatus shown in FIG. 13, the cooling water is circulated by the pump 38 using the loop of (1) before the temperature rise of the heat source. According to the loop of {circle around (1)}, an amount of the cooling water is less than that of the loop of {circle around (2)}. Therefore, according to the loop of {circle around (1)}, the cooling water is fully cooled by the heat exchanger 39.

On the other hand, after the temperature of the heat source is raised, the middle part bypass 366 is closes by the middle part switch valve 376 so as to circulate the cooling water by the pump 38 using the loop of {circle around (2)}. Thereby, the sufficiently cooled cooling water flows immediately into the middle part cooling slot 41, which permits quick cooling even if a thermal fluctuation of the heat source is large.

Moreover, if the thermal fluctuation is small, an amount of the cooling water can be reduced by using the loop of {circle around (1)}, and, thus, energy conservation can be achieved as compared to the case where the cooling water is circulated always according to the loop of {circle around (2)}.

Moreover, according to the present embodiment, similar to each of the above-mentioned embodiments, the first flow passage 16, which cools the temperature controlled object by the circulating first cooling water 15 and the second flow passage 19 separate from the first flow passage 16 are provided so as to carry out heat exchange between the second cooling water 18 flowing through the second flow passage 19 and the first cooling water 15. Thus, there is no need to store the first cooling water 15 in a tank having a constant capacity, and the heat of the entire first cooling water 15 flowing through the first flow passage 16 is absorbed by the second cooling water 18 in a part corresponding to a chiller, and, thereby, a response to a load fluctuation of the temperature controlled object is speeded up, and waste of energy can be reduced while improving the accuracy of the temperature control.

Moreover, since there is provided flow amount control means for controlling an amount of flow of the second cooling water 18 flowing through the second flow passage 19, the waste of energy such as cooling by a chiller side as conventionally done and further heating at the same location so as to make the first cooling water 15 of a predetermined temperature can be avoided. Additionally, a change can be made to an appropriate amount of flow with respect to a load fluctuation of the temperature controlled object, a response to the load fluctuation of the temperature controlled object becomes quick, and an accuracy of the temperature control can be improved.

Figure 14:
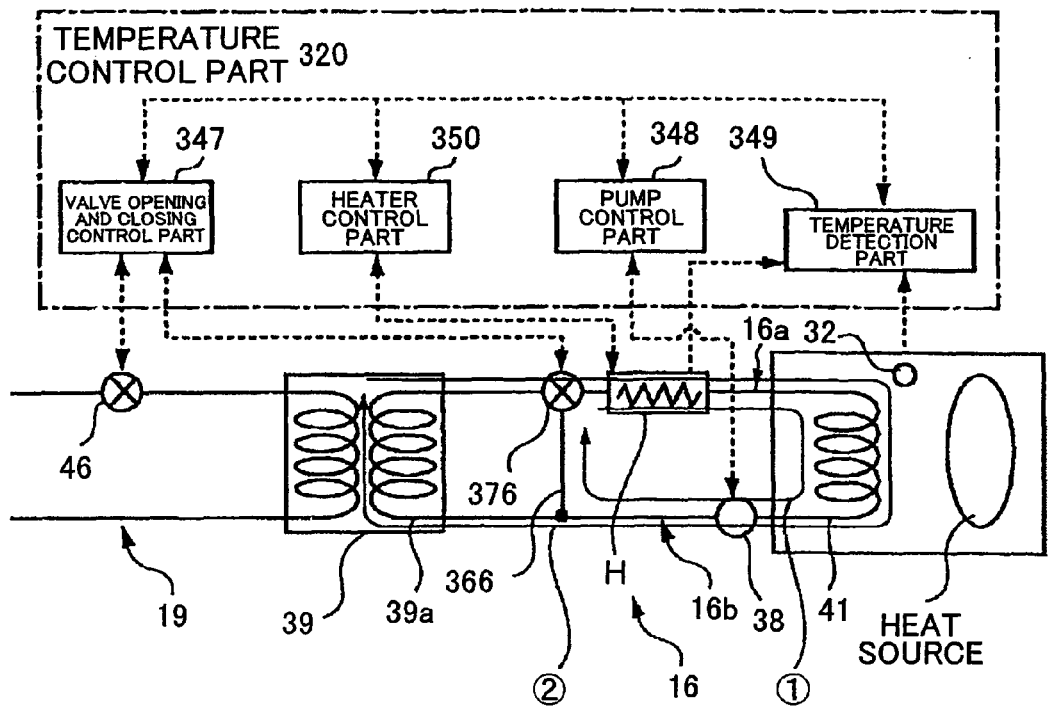
FIG. 14 is an explanatory diagram showing another example of the CVD process part shown in FIG. 11 and FIG. 12.

FIG. 14 is a diagram showing an apparatus of another example of the CVD apparatus according to the embodiment shown in FIG. 11 and FIG. 12. In this example, a heater H is provided to heat or temperature-control the first cooling water 15 flowing through the upstream passage 16a. The temperature detection part 349 electronically monitors the temperature of the heater H. The heater control part 350 controls the heater H based on information of the temperature detection part 349.

A description will be given of an operation of the CVD process part constituted as mentioned above. If it is determined by the temperature sensor 32 and the temperature detection part 349 that the temperature of the heat source if lower than a predetermined temperature, such information is transmitted to at least the valve opening and closing control part 347 and the heater control part 350. The valve opening and closing control part 347 controls the valve to flow the cooling water according to the loop of {circle around (1)}. The heater control part 350 controls to heat or temperature-control the flowing cooling water according to the loop of {circle around (1)}. When the temperature of the heat source reaches a desired temperature, an activation of the heater H is stopped. Or, when the temperature of the heat source reaches a desired temperature, for example, the heater control part 350 controls the heater H to maintain the temperature. On the other hand, if the heat source is at a temperature higher than the desired temperature, the heater H is not activated and lets the cooling water to flow according to the loop of {circle around (2)} so as achieve temperature control such as explained in the above-mentioned embodiments.

In the present invention, since only the first cooling water 15 passing through the middle part bypass 366 can be heated or temperature-controlled, the temperature of the heat source can be adjusted quickly to a desired temperature. Thereby, the temperature of the heat source can be kept constant as much as possible. Additionally, since the heater H can heat or temperature-control the cooling water passing through the middle part bypass 366, an energy efficiency can be high as compared to the case where the cooling water passing through the heat exchange passage 39a is heated or temperature-controlled.

Moreover, in the present embodiment, even if, for example, the heat source is 0 W, the heat source can be heated or temperature-controlled by providing the heater H. Accordingly, even if the heat source is 0 W, the housing 23 can be heated or temperature-controlled to be at a desired temperature by causing the heated or temperature-controlled cooling water to flow in the upper part cooling slot 40, the middle part cooling slot 41, the lower part cooling slot 42, etc., shown in FIG. 11.

Figure 15:
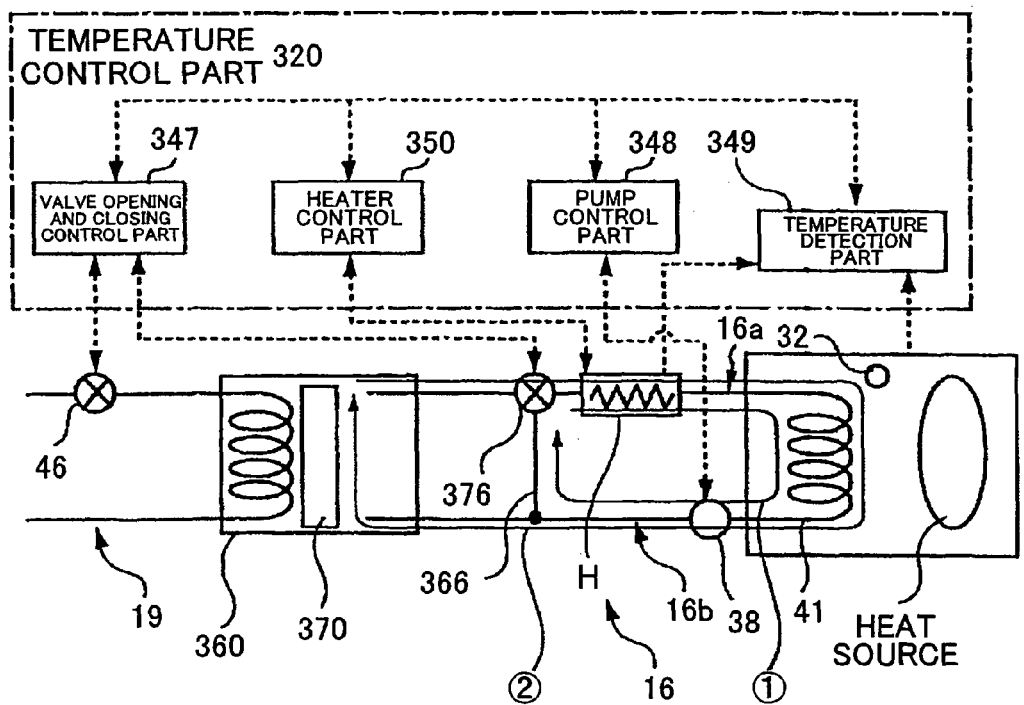
FIG. 15 is an explanatory diagram showing another example of the CVD process part shown in FIG. 14.

FIG. 15 is a diagram showing another example of the CVD process part shown in FIG. 14. In this example, the heat exchanger comprises a tank 360 for storing and circulating the first cooling water 15 and a refrigerating machine 370. The above-mentioned heat exchange passage 39a corresponds to the tank 360 of the present embodiment.

A description will be give of an operation of the CVD process part constituted as mentioned above. In the present embodiment, the temperature of the first cooling water 15 in the tank 360 is controlled to be always at a predetermined temperature by the refrigerating machine 370. The temperature inside the tank 360 is, for example, −20° C.

If the temperature of the heat source is judged to be higher than the desired temperature by the middle part temperature sensor 32 and the temperature detection part 349, such information is transmitted to at least the valve opening and closing control part 347. The valve opening and closing control part 347 controls the valve 46 to cause the cooling water to flow according to the loop of {circle around (2)}. On the other hand, if the temperature of the heat source is lower than the desired temperature, the cooling water is caused to flow according to the loop of {circle around (1)} so as to lower the temperature of the heat source. Thereby, the temperature of the heat source can be maintained constant to the utmost and it becomes possible to carry out accurate temperature control.

In the case of the present invention, it is preferable to use secondary heater H. For example, it is used if the temperature of the heat source is decreased excessively due to excessive circulation of the cooling water according to the loop of {circle around (2)}. Or, it is used if the temperature of the heat source is decreased excessively due to external causes. In such a case, the heater H is activated so as to carry out fine adjustment to cause the heat source to be the desired temperature. Thereby, more accurate temperature control can be carried out.

Figure 16:
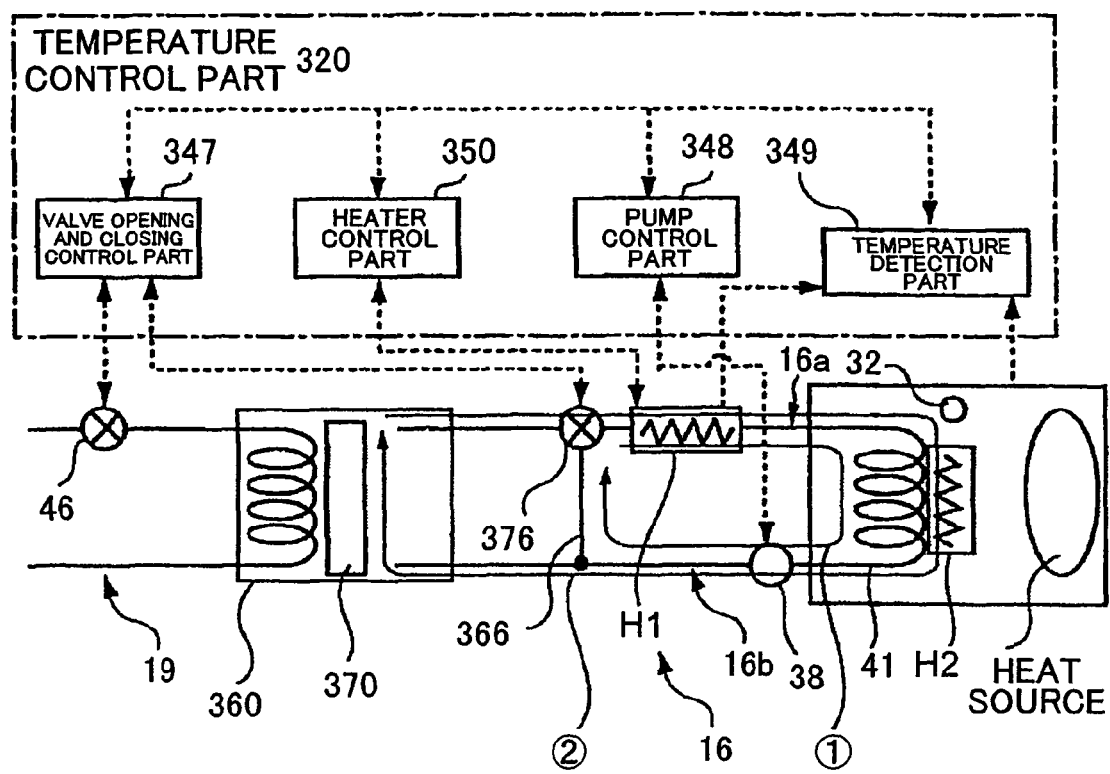
FIG. 16 is an explanatory diagram showing another example of the CVD process part shown in FIG. 15.

In addition a heater H1 and a heater H2 may be provided further to the heat source side as shown in FIG. 16. The heater H2 can be provided, for example, near the upper part cooling slot 40, the middle part cooling slot 41, or the lower part cooling slot 42, etc. Also in such a case, the heater H2 may be used in a secondary manner. For example, it is used if the temperature of the heat source is decreased excessively due to excessive circulation of the cooling water according to the loop of {circle around (2)}. Or, it is used if the temperature of the heat source is decreased excessively due to external causes. In such a case, the heater H2 is activated so as to carry out fine adjustment to cause the heat source to be the desired temperature. Thereby, more accurate temperature control can be carried out than the apparatus shown in FIG. 15.

It should be noted that the present invention is not limited to any of the above-mentioned embodiments, and can be implemented by appropriately changing within the scope of the technical thought of the present invention.

For example, although the description is focused on the case, as an example, where a temperature of the temperature controlled object is controlled in the above-mentioned embodiments, the present invention is not limited to that, and is applicable to a case of raising a temperature of the process part body itself. Thus, a heat exchange efficiency in various kinds of substrate processing is further increased, which reduces waste of energy.

Moreover, although heat exchange is carried out efficiently by providing the first flow passage 16 and the second flow passage 19 for all of the upper part cooling slot 40, the middle part cooling slot 41 and the lower part cooling slot 42 of the housing 23 of the process part body 14 in the above-mentioned embodiment, the present invention is not limited to this and may be provided to one of them or a cooling slot may be formed further at other locations of the process part body 14. Thereby, further energy conservation can be achieved as the process part body 14 as a whole.

Further, although the main body side middle part flow passage 36a and the middle part body flow passage 44a are formed by the first flow passage 16 and the second flow passage 19 in the above-mentioned embodiments, the present invention is not limited to this, and more flow passages may be formed by increasing the number of branches or, for example, the body side upper part flow passage 35 may be parallelized.

Thereby, while being able to raise the cooling capability of the process part 14 for a temperature controlled object can be increased, the temperature control of the temperature controlled object can be carried out most efficiently and quickly by controlling the heat exchanger 39, the pump 38, and the valve 46 which are arranged side by side if needed.

Additionally, although it is explained that the cooling water does not always flow through the heat exchanger 39 and the middle part cooling slot 41 even if the pump 38 is rotated in the above-mentioned embodiment, the present invention is not limited to this. For example, it can be made possible to cause the cooling water through the flow passage through the heat exchanger 39 and the middle part cooling slot 41 if the pump 38 is rotated and cause the first cooling water 15 to flow through the middle part bypass 366 by a valve if needed. Thereby, an amount of flow into the middle part cooling slot 41 can be adjusted to a necessary amount and temperature control accurately corresponding to a temperature change can be made, which reduces waste of energy.

The present invention is not limited to the specifically disclosed embodiments and variations and modifications may be made without departing from the scope of the present invention.

The invention claimed is:

1. A substrate processing apparatus comprising:
   a substrate processing part that has a temperature controlled object and applies a predetermined process to a substrate, the temperature controlled object being a part of an apparatus housing of said substrate processing part;
   a first flow passage that causes a first temperature control fluid to circulate, a part of the first flow passage passing through said substrate processing part, the first temperature control fluid for controlling a temperature of said temperature controlled object;
   a second flow passage that causes a second temperature control fluid to flow therethrough, the second temperature control fluid cooling said first temperature control fluid;
   a heat exchanger that causes a heat exchange between said first temperature control fluid and said second temperature control fluid, the heat exchanger being provided between the first flow passage and the second flow passage, distal to the substrate processing part and not in contact with the substrate processing part; and
   a flow amount control means for controlling an amount of flow of at least said second temperature control fluid.

2. The substrate processing apparatus as claimed in claim 1, further comprising temperature detection means provided in said substrate processing part for detecting a temperature of said temperature controlled object in said first flow passage.

3. The substrate processing apparatus as claimed in claim 2, wherein said flow amount control means controls an amount of flow of said second temperature control fluid based on information detected by said temperature detection means.

4. The substrate processing apparatus as claimed in claim 2, further comprising:
   a pump that is provided in said first flow passage to cause said first temperature control fluid to circulate; and
   means for controlling an operation of said pump based on information detected by said temperature detection means.

5. The substrate processing apparatus as claimed in claim 1, wherein said substrate processing part includes:

a heater that secondarily heats the substrate processing part; and temperature control means that controls a temperature of said heater.

6. The substrate processing apparatus as claimed in claim 1, wherein said second flow passage is branched into a plurality of flow passages in a middle thereof, and said flow amount control means and the first flow passage are provided in each of the branched second flow passages, said first temperature control fluid, which exchanges heat with the second temperature control fluid flowing through the branched second flow passages, respectively, circulating through the first flow passage.

7. The substrate processing apparatus as claimed in claim 6, wherein said respectively formed plurality of first flow passages are formed by being brought together into one first flow passage in a middle.

8. The substrate processing apparatus as claimed in claim 1, wherein said first flow passage includes: an upstream passage in which said first temperature control fluid flows into said part of the flow passage; a downstream passage in which said first temperature control fluid flows out of said part of the flow passage; a bypass connecting said upstream passage and said downstream passage; and a heat exchange passage provided adjacent to said second flow passage to carry out heat-exchange with said second temperature control fluid, wherein the substrate processing apparatus further comprises switch means for switching between a circulation passage of said first temperature control fluid comprising said upstream passage, said part of the flow passage, said downstream passage and said bypass and a circulation passage of said first temperature control fluid comprising said downstream passage and said heat exchange passage.

9. The substrate processing apparatus as claimed in claim 8, wherein said switch means changes a ratio of an amount of flow of said first temperature control fluid flowing through the circulation passage comprising said upstream passage, said part of the flow passage, said downstream passage and said bypass and an amount of flow of said first temperature control fluid flowing through the circulation passage comprising said upstream passage, said part of the flow passage, said downstream passage and said heat exchange passage to an arbitrary ratio.

10. The substrate processing apparatus as claimed in claim 8, comprising:

temperature detection means provided in said substrate processing part for detecting a temperature of said temperature controlled object in said first flow passage; and means for controlling a switching operation of said switch means based on information detected by said temperature detection means.

11. The substrate processing apparatus as claimed in claim 10, further comprising a heating mechanism heating said first temperature control fluid circulating through said upstream passage, said part of the flow passage, said downstream passage and said bypass.

12. The substrate processing apparatus as claimed in claim 11, wherein the means for controlling the switching operation of said switch means further includes means for controlling a heating temperature of said heating mechanism based on the information detected by said temperature detection means.

13. The substrate processing apparatus as claimed in claim 8, further comprising a cooling mechanism cooling said first temperature control fluid flowing through said heat exchange passage.

14. A substrate processing apparatus comprising:

a substrate processing part that has a temperature controlled object and applies a predetermined process to a substrate, the temperature controlled object being a part of an apparatus housing of said substrate processing part;

a first flow passage that causes a first temperature control fluid to circulate, a part of the first flow passage passing through said substrate processing part, the first temperature control fluid for controlling a temperature of said temperature controlled object;

a second flow passage that causes a second temperature control fluid to flow therethrough, the second temperature control fluid cooling said first temperature control fluid;

a heat exchanger that causes a heat exchange between said first temperature control fluid and said second temperature control fluid, the heat exchanger being provided between the first flow passage and the second flow passage, distal to the substrate processing part and not in contact with the substrate processing part; and a flow amount control means for controlling an amount of flow of said first temperature control fluid.

15. The substrate processing apparatus as claimed in claim 14, further comprising temperature detection means provided in said substrate processing part for detecting a temperature of said temperature controlled object in said first flow passage.

16. The substrate processing apparatus as claimed in claim 15, wherein said flow amount control means controls an amount of flow of said first temperature control fluid based on information detected by said temperature detection means.

17. The substrate processing apparatus as claimed in claim 14, wherein said first flow passage includes: an upstream passage in which said first temperature control fluid flows into said part of the flow passage; a downstream passage in which said first temperature control fluid flows out of said part of the flow passage; a bypass connecting said upstream passage and said downstream passage; and a heat exchange passage provided adjacent to said second flow passage to carry out heat-exchange with said second temperature control fluid, wherein the substrate processing apparatus further comprises switch means for switching between a circulation passage of said first temperature control fluid comprising said upstream passage, said part of the flow passage, said downstream passage and said bypass and a circulation passage of said first temperature control fluid comprising said downstream passage and said heat exchange passage.

18. The substrate processing apparatus as claimed in claim 17, wherein said switch means changes a ratio of an amount of flow of said first temperature control fluid flowing through the circulation passage comprising said upstream passage, said part of the flow passage, said downstream passage and said bypass and an amount of flow of said first temperature control fluid flowing through the circulation passage comprising said upstream passage, said part of the flow passage, said downstream passage and said heat exchange passage to an arbitrary ratio.

19. The substrate processing apparatus as claimed in claim 17, comprising:

temperature detection means provided in said substrate processing part for detecting a temperature of said temperature controlled object in said first flow passage; and means for controlling a switching operation of said switch means based on information detected by said temperature detection means.

20. The substrate processing apparatus as claimed in claim 19, further comprising a heating mechanism heating said first temperature control fluid circulating through said upstream passage, said part of the flow passage, said downstream passage and said bypass.

21. The substrate processing apparatus as claimed in claim 20, wherein the means for controlling the switching operation of said switch means further includes means for controlling a heating temperature of said heating mechanism based on the information detected by said temperature detection means.

22. The substrate processing apparatus as claimed in claim 17, further comprising a cooling mechanism cooling said first temperature control fluid flowing through said heat exchange passage.

* * * * *